(12) United States Patent
Morohashi

(10) Patent No.: US 9,160,394 B2
(45) Date of Patent: Oct. 13, 2015

(54) DATA REPRODUCTION CIRCUIT AND DATA TRANSMISSION DEVICE

(71) Applicant: Sony Corporation, Tokyo (JP)

(72) Inventor: Hideo Morohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 52 days.

(21) Appl. No.: 13/749,414

(22) Filed: Jan. 24, 2013

(65) Prior Publication Data
US 2013/0195159 A1 Aug. 1, 2013

(30) Foreign Application Priority Data

Feb. 1, 2012 (JP) .................. 2012-019989
Feb. 1, 2012 (JP) .................. 2012-019991

(51) Int. Cl.
*H04L 5/16* (2006.01)
*H04B 1/40* (2015.01)
*H03K 5/24* (2006.01)
*H03K 5/08* (2006.01)

(52) U.S. Cl.
CPC .................. *H04B 1/40* (2013.01); *H03K 5/084* (2013.01); *H03K 5/24* (2013.01); *H03K 5/2409* (2013.01)

(58) Field of Classification Search
CPC  H04M 11/06; H04M 11/062; H04L 25/4927; H04L 5/1438; H04L 27/2608; H04B 1/40; H03K 5/084; H03K 5/2409; H03K 5/24
USPC .......................................... 375/222
See application file for complete search history.

(56) References Cited

U.S. PATENT DOCUMENTS

| 6,091,557 A * | 7/2000 | Hashizume ............... 360/46 |
| 2005/0083044 A1* | 4/2005 | Fujii et al. ............. 324/207.25 |
| 2011/0062943 A1* | 3/2011 | Kihara et al. ............. 324/76.39 |
| 2013/0002242 A1* | 1/2013 | Tsukamoto et al. ...... 324/207.12 |

FOREIGN PATENT DOCUMENTS

| JP | 10-145436 | 5/1998 |
| JP | 11-098130 | 4/1999 |
| JP | WO2011/104961 | * 9/2011 ............. G01D 5/244 |

* cited by examiner

*Primary Examiner* — Dhaval Patel
(74) *Attorney, Agent, or Firm* — Michael Best & Friedrich LLP

(57) ABSTRACT

Disclosed herein is a data reproduction circuit including: a comparator configured to compare input data resulting from capacitive coupling with a comparison voltage as a threshold voltage and output a comparison result; and a comparison voltage variable section configured to change the comparison voltage along a mark rate of the input data and supply the changed comparison voltage to the comparator.

12 Claims, 15 Drawing Sheets

<u>1</u>

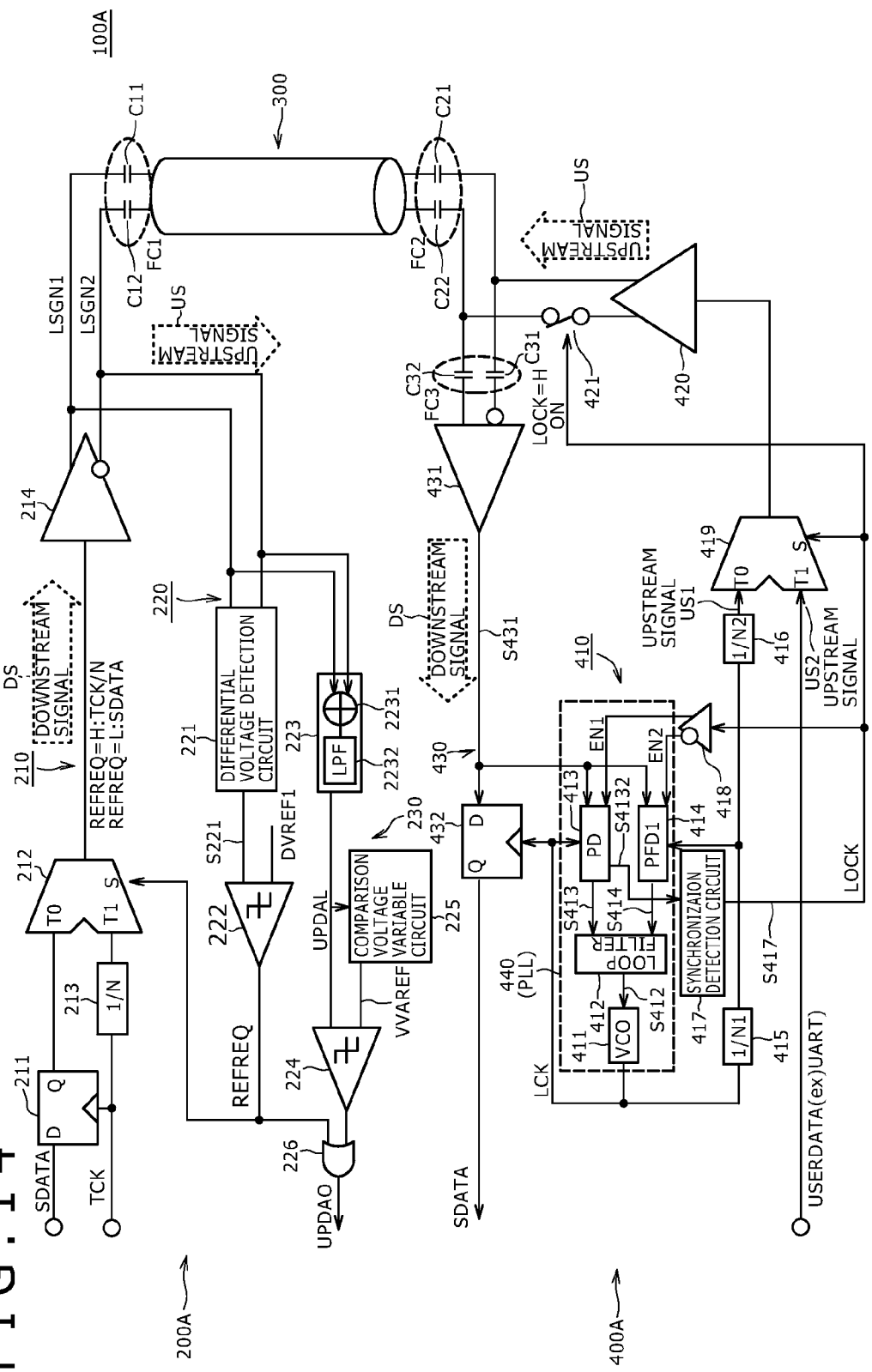
F I G . 1 4

F I G . 1 5
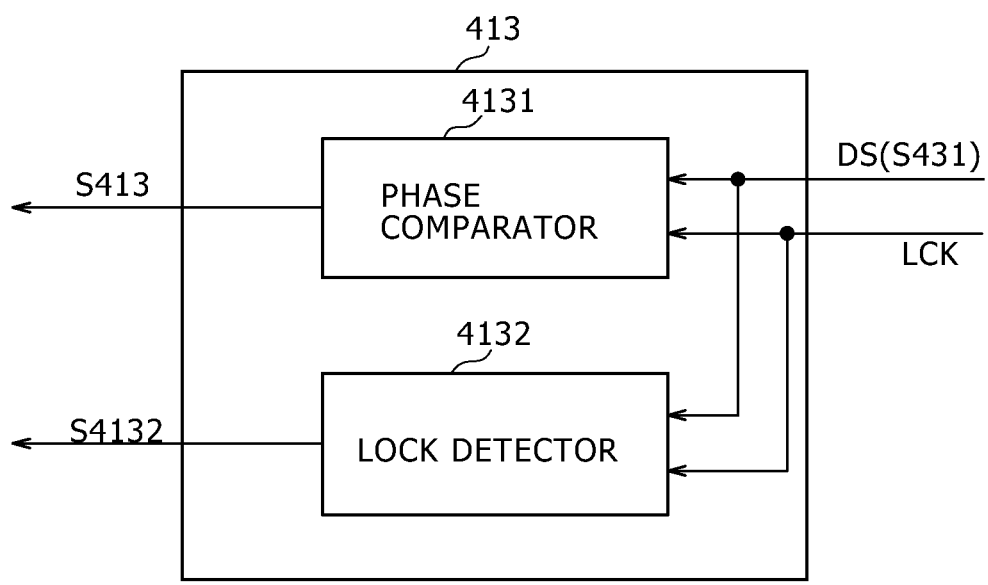

DATA REPRODUCTION CIRCUIT AND DATA
TRANSMISSION DEVICE

BACKGROUND

The present disclosure relates to a data reproduction circuit to which data is input via e.g. a transmission line and a data transmission device using the data reproduction circuit.

The serial data transmission is excellent in space saving because a signal can be transmitted by one or a pair of transmission media. Furthermore, it is free from a problem of skew between data (timing deviation) occurring when a signal is transmitted by a multi-core signal transmission line and therefore is suitable for long-distance data transmission.

In Japanese Patent Laid-open No. Hei 10-145436 and Japanese Patent Laid-open No. Hei 11-98130 (hereinafter, Patent Documents 1 and 2), a data transmission device that simultaneously transmits downstream data and a reference clock request signal that is an upstream common-mode signal is described.

According to this data transmission device, simplification of the circuit configuration and space saving of the transmission line are achieved and a wide range of the data transmission rate can be covered. Thus, the data transmission device has an advantage of being capable of realizing high-speed data transmission and transmission of the reference clock request signal with a simple circuit configuration.

This data transmission device is provided with a data reproduction circuit that detects the upstream common-mode signal transmitted via the transmission line and reproduces data in accordance with the result of comparison between the detected signal and a reference voltage in a comparator.

FIG. 1 is a diagram showing a general configuration example of the data reproduction circuit using a comparator.

FIG. 2 is a timing chart of the data reproduction circuit of FIG. 1.

A data reproduction circuit 1 of FIG. 1 is configured by a comparator 2 to which an input voltage (data) VIN and a reference voltage VREF are input.

SUMMARY

The above-described data reproduction circuit 1 has no problem in a general system. However, depending on the system, AC (alternating current) coupling by a capacitor C1 is often necessary as shown in FIG. 3 for avoidance of a problem of short-circuiting with another power supply and so forth and due to e.g. diversification of the system.

FIG. 3 is a diagram showing the basic configuration of the data reproduction circuit to which AC coupling is applied.

FIG. 4 is a timing chart of the data reproduction circuit of FIG. 3.

In a data reproduction circuit 1A of FIG. 3, a bias circuit 3 is connected to an input line of input data VIN' resulting from capacitive coupling by the capacitor C1.

In this data reproduction circuit 1A, to which AC coupling is applied, the input data VIN' resulting from the capacitive coupling loses DC information as shown in the timing diagram of FIG. 4 and thus the DC value varies.

Therefore, an error occurs in the reproduced data obtained from an output VOUT of the comparator 2, which uses the constant reference voltage VREF as the comparison voltage.

FIG. 5 is a diagram showing an example in which the mark rate of input data is extreme.

FIG. 5 shows an example in which the mark rate of input data is further extreme. It turns out that data reproduction is further difficult in this case.

Regarding the data reproduction explained thus far, there is a technique called quantized feedback (QFB) as a method for reproducing the lost DC-side component at a later stage.

In this technique, the configuration is complicated and a low-pass filter (LPF) having a time constant equivalent to that of a high-pass filter (HPF) is necessary. Therefore, incorporation of this technique into an integrated circuit (IC) is very difficult.

There is also a method in which transmission data is turned to a balanced code on the transmitting side to suppress DC variation.

However, this method requires an encoder of e.g. 8B10B. Furthermore, a decoder is also necessary on the receiving side. Thus, the configuration is complicated.

Also in the case of transmitting an upstream communication signal via AC coupling in the data transmission device described in Patent Documents 1 and 2, data reproduction is difficult as described above.

Furthermore, upstream communication of user transmission and so forth from the receiver side is necessary due to e.g. diversification of the system. Moreover, the number of cases in which a transmission line is AC-coupled is increasing in order to prevent a large current from flowing when the transmission line is short-circuited to a power supply (to a battery, in the case of in-vehicle apparatus). Thus, it is impossible for the above-described technique to cope with the present situation.

This is because of the following reason. Specifically, when AC coupling is employed, data resulting from the coupling loses DC information. Thus, there is a limit to the width of the pulse that can be transmitted and therefore it is difficult to discriminate two or more kinds of common-mode signals.

There is a need for the present disclosure to provide a data transmission device and a data transmission method that permit two or more kinds of signals to be transmitted as upstream communication in conjunction with downstream communication by a pair of AC-coupled data transmission lines.

There is another need for the present disclosure to provide a data reproduction circuit and a data transmission device that permit stable data reproduction with suppression of increase in the complexity of the configuration in data transmission via AC coupling.

According to an embodiment of the present disclosure, there is provided a data reproduction circuit including a comparator configured to compare input data resulting from capacitive coupling with a comparison voltage as a threshold voltage and output a comparison result, and a comparison voltage variable section configured to change the comparison voltage along the mark rate of the input data and supply the changed comparison voltage to the comparator.

According to another embodiment of the present disclosure, there is provided a data transmission device including a transmission line configured to be formed by a pair of signal lines to which a capacitor that blocks a direct-current component and allows the passage of an alternating-current signal based on a transmission signal is connected, a first transmitter/receiver that transmits transmission data via the transmission line at a transmission rate set by a transmission clock signal, and a second transmitter/receiver that reproduces a reception clock signal based on a reception signal received via the transmission line and receives transmission data transmitted from the first transmitter/receiver. The first transmitter/receiver includes an output circuit that selects either the transmission data or a reference clock signal in accordance with a selection control signal and outputs the transmission data or the reference clock signal to the transmission line, and a data reproduction circuit that detects a common-mode signal transmitted from the second transmitter/receiver via the transmission line and reproduces input data resulting from capacitive coupling. The data reproduction circuit includes a comparator that compares the input data resulting from capacitive coupling with a comparison voltage as a threshold voltage and outputs a comparison result, and a comparison voltage variable section that changes the comparison voltage along the mark rate of the input data and supplies the changed comparison voltage to the comparator. The second transmitter/receiver includes a clock reproduction circuit that generates a clock signal in response to the reference clock signal or the transmission data transmitted via the transmission line. The second transmitter/receiver outputs a request signal to the transmission line if the frequency of the clock signal generated by the clock reproduction circuit is different from the signal frequency of the transmission line.

According to another embodiment of the present disclosure, there is provided a data transmission device including a transmission line configured to be formed by a pair of signal lines to which a capacitor that blocks a direct-current component and allows the passage of an alternating-current signal based on a transmission signal is connected, a first transmitter/receiver that transmits transmission data via the transmission line at a transmission rate set by a transmission clock signal, and a second transmitter/receiver that reproduces a reception clock signal based on a reception signal received via the transmission line and receives the transmission data transmitted from the first transmitter/receiver. The first transmitter/receiver includes an output circuit that selects either the transmission data or a reference clock signal in accordance with a selection control signal and outputs the transmission data or the reference clock signal to the transmission line. The first transmitter/receiver further includes a signal receiver that receives a single-phase signal with a positive phase or a reverse phase and a both-phase signal with a positive phase and a reverse phase transmitted from the second transmitter/receiver via the transmission line to separate and determine the single-phase signal and the both-phase signal in association with the voltage difference of the received signal, and generates the selection control signal to select the transmission data or the reference clock signal depending on a determination result to output the selection control signal to the output circuit. The second transmitter/receiver includes a clock reproduction circuit that generates a clock signal in response to the reference clock signal or the transmission data transmitted via the transmission line and outputs a request signal to the transmission line as a single-phase signal or a common-mode signal if the frequency of the generated clock signal is different from the signal frequency of the transmission line. The second transmitter/receiver outputs predetermined data to the transmission line as a both-phase signal if the frequency of the generated clock signal is equivalent to the signal frequency of the transmission line. The second transmitter/receiver is capable of transmitting the single-phase signal and the both-phase signal to the transmission line simultaneously in parallel.

According to another embodiment of the present disclosure, there is provided a data transmission device including a transmitter/receiver configured to transmit transmission data at a transmission rate set by a transmission clock signal via a transmission line formed by a pair of signal lines to which a capacitor that blocks a direct-current component and allows the passage of an alternating-current signal based on a transmission signal is connected, and receive a signal transmitted via the transmission line. The transmitter/receiver includes an output circuit that selects either the transmission data or a reference clock signal in accordance with a selection control signal and outputs the transmission data or the reference clock signal to the transmission line, and a signal receiver that receives a single-phase signal with a positive phase or a reverse phase and a both-phase signal with a positive phase and a reverse phase transmitted via the transmission line to separate and determine the single-phase signal and the both-phase signal in association with the voltage difference of the received signal, and generates the selection control signal to select the transmission data or the reference clock signal depending on a determination result to output the selection control signal to the output circuit.

According to another embodiment of the present disclosure, there is provided a data transmission device including a transmitter/receiver configured to reproduce a reception clock signal based on a reception signal received via a transmission line formed by a pair of signal lines to which a capacitor that blocks a direct-current component and allows the passage of an alternating-current signal based on a transmission signal is connected, and receive transmission data transmitted via the transmission line. The transmitter/receiver includes a clock reproduction circuit that generates a clock signal in response to a reference clock signal or the transmission data transmitted via the transmission line and outputs a request signal to the transmission line as a single-phase signal or a common-mode signal if the frequency of the generated clock signal is different from the signal frequency of the transmission line. The transmitter/receiver outputs predetermined data to the transmission line as a both-phase signal if the frequency of the generated clock signal is equivalent to the signal frequency of the transmission line. The transmitter/receiver is capable of transmitting the single-phase signal and the both-phase signal to the transmission line simultaneously in parallel.

According to another embodiment of the present disclosure, there is provided a data transmission method including a first transmission/reception step of transmitting transmission data at a transmission rate set by a transmission clock signal via a transmission line formed by a pair of signal lines to which a capacitor that blocks a direct-current component and allows the passage of an alternating-current signal based on a transmission signal is connected, and a second transmission/reception step of reproducing a reception clock signal based on a reception signal received via the transmission line and receiving the transmission data transmitted via the transmission line. The first transmission/reception step includes selecting either the transmission data or a reference clock signal in accordance with a selection control signal and outputting the transmission data or the reference clock signal to the transmission line. The first transmission/reception step further includes receiving a single-phase signal with a positive phase or a reverse phase and a both-phase signal with a positive phase and a reverse phase transmitted via the transmission line to separate and determine the single-phase signal and the both-phase signal in association with the voltage difference of the received signal, and generating the selection control signal to select the transmission data or the reference clock signal depending on a determination result. The second transmission/reception step includes generating a clock signal in response to the reference clock signal or the transmission data transmitted via the transmission line, outputting a request signal to the transmission line as a single-phase signal or a common-mode signal if the frequency of the generated clock signal is different from the signal frequency of the transmission line, and outputting predetermined data to the transmission line as a both-phase signal if the frequency of the generated clock signal is equivalent to the signal frequency of the transmission line. The second transmission/reception step is capable of transmitting single-phase signal and the both-phase signal to the transmission line simultaneously in parallel.

According to another embodiment of the present disclosure, there is provided a data transmission method including a transmission/reception step of transmitting transmission data at a transmission rate set by a transmission clock signal via a transmission line formed by a pair of signal lines to which a capacitor that blocks a direct-current component and allows the passage of an alternating-current signal based on a transmission signal is connected, and receiving a signal transmitted via the transmission line. The transmission/reception step includes selecting either the transmission data or a reference clock signal in accordance with a selection control signal and outputting the transmission data or the reference clock signal to the transmission line. The transmission/reception step further includes receiving a single-phase signal with a positive phase or a reverse phase and a both-phase signal with a positive phase and a reverse phase transmitted via the transmission line to separate and determine the single-phase signal and the both-phase signal in association with the voltage difference of the received signal, and generating the selection control signal to select the transmission data or the reference clock signal depending on a determination result.

According to another embodiment of the present disclosure, there is provided a data transmission method including a transmission/reception step of reproducing a reception clock signal based on a reception signal received via a transmission line formed by a pair of signal lines to which a capacitor that blocks a direct-current component and allows the passage of an alternating-current signal based on a transmission signal is connected, and receiving transmission data transmitted via the transmission line. The transmission/reception step includes generating a clock signal in response to a reference clock signal or the transmission data transmitted via the transmission line, outputting a request signal to the transmission line as a single-phase signal or a common-mode signal if the frequency of the generated clock signal is different from the signal frequency of the transmission line, and outputting predetermined data to the transmission line as a both-phase signal if the frequency of the generated clock signal is equivalent to the signal frequency of the transmission line. The transmission/reception step is capable of transmitting single-phase signal and the both-phase signal to the transmission line simultaneously in parallel.

According to the embodiments of the present disclosure, it is possible to stably perform data reproduction with suppression of increase in the complexity of the configuration in data transmission via AC coupling.

Furthermore, it is possible to transmit two or more kinds of signals as upstream communication in conjunction with downstream communication by a pair of AC-coupled data transmission lines.

BRIEF DESCRIPTION OF THE DRAWINGS

FIG. 14 is a circuit diagram showing a data transmission device to which a data reproduction circuit according to a sixth embodiment is applied;

FIG. 15 is a circuit diagram showing one configuration example of a phase detector;

DETAILED DESCRIPTION OF THE PREFERRED EMBODIMENTS

Embodiments of the present disclosure will be described below in association with the drawings.

The description will be made based on the following order.
1. First Embodiment (first configuration example of data reproduction circuit)
2. Second Embodiment (second configuration example of data reproduction circuit)
3. Third Embodiment (third configuration example of data reproduction circuit)
4. Fourth Embodiment (fourth configuration example of data reproduction circuit)
5. Fifth Embodiment (fifth configuration example of data reproduction circuit)
6. Sixth Embodiment (first configuration example of data transmission device)
7. Seventh Embodiment (second configuration example of data transmission device)
8. Eighth Embodiment (third configuration example of data transmission device)
9. Ninth Embodiment (fourth configuration example of data transmission device)
10. Tenth Embodiment (fifth configuration example of data transmission device)
11. Eleventh Embodiment (sixth configuration example of data transmission device)

1. First Embodiment

Figure 1:
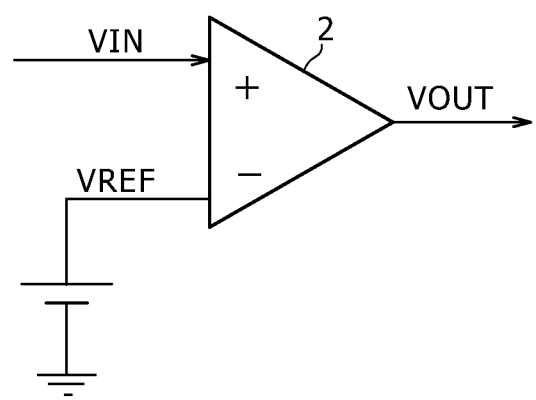
FIG. 1 is a diagram showing a general configuration example of a data reproduction circuit using a comparator.
Figure 2:
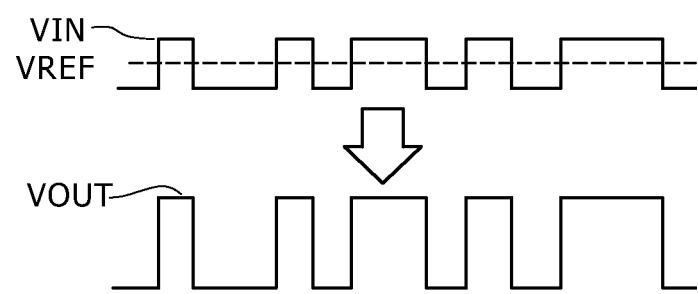
FIG. 2 is a timing chart of the data reproduction circuit of FIG. 1.
Figure 3:
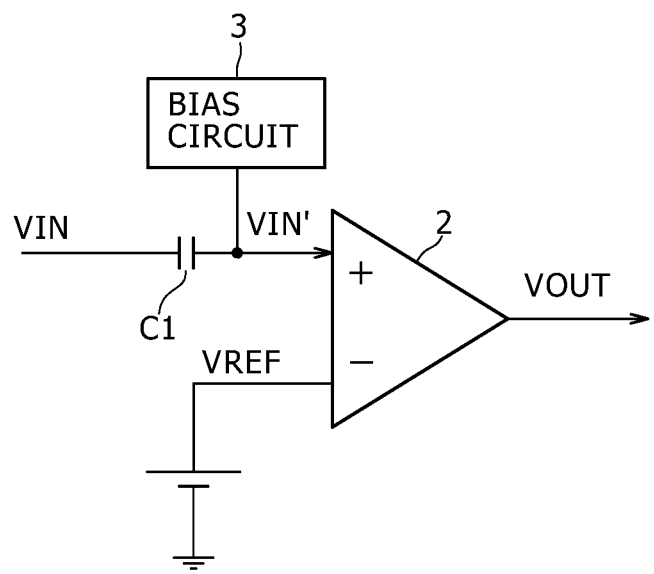
FIG. 3 is a diagram showing the basic configuration of a data reproduction circuit to which AC coupling is applied.
Figure 4:
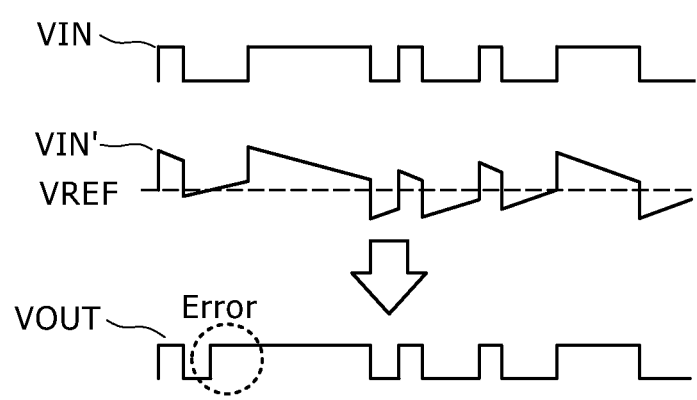
FIG. 4 is a timing chart of the data reproduction circuit of FIG. 3.
Figure 5:
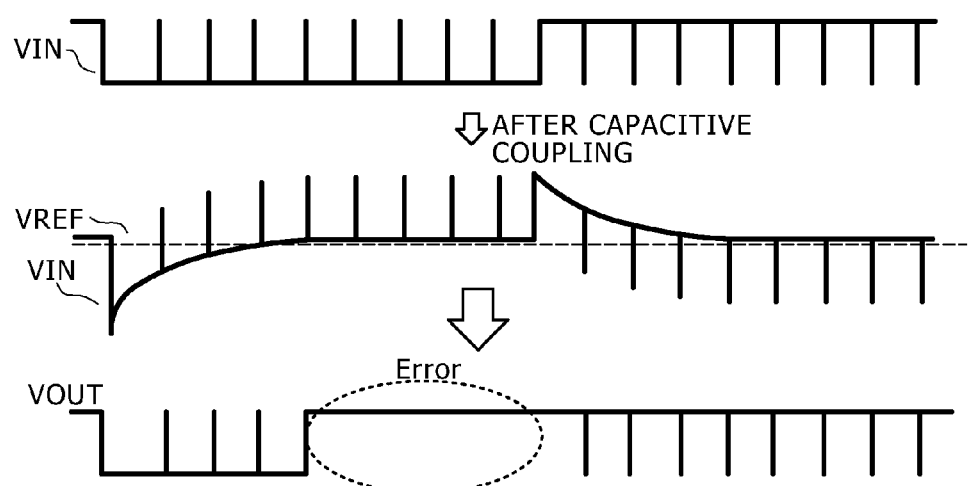
FIG. 5 is a diagram showing an example in which the mark rate of input data is extreme.
Figure 6:
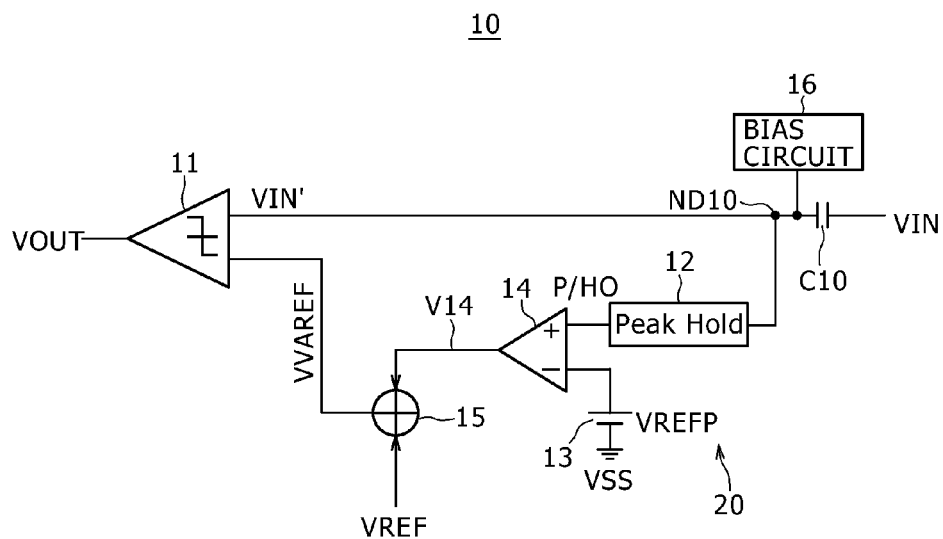
FIG. 6 is a circuit diagram showing a data reproduction circuit according to a first embodiment.

FIG. 6 is a circuit diagram showing a data reproduction circuit according to the present first embodiment.

Figure 7:
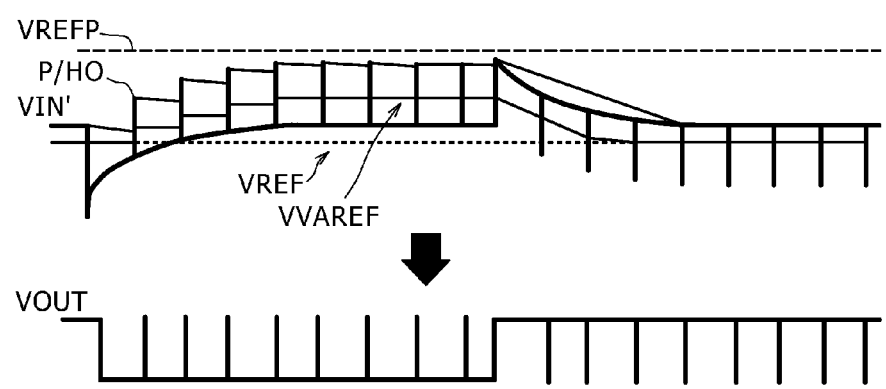
FIG. 7 is a timing chart of the data reproduction circuit of FIG. 6.

FIG. 7 is a timing chart of the data reproduction circuit of FIG. 6.

As shown in FIG. 6, a data reproduction circuit 10 according to the present first embodiment has a comparator 11, a peak hold circuit 12, a reference voltage source 13, an operational amplifier (Op Amp) 14, an adder 15, a bias circuit 16, and an input node ND10.

Furthermore, a capacitor C10 for AC coupling is disposed at the input stage of input data VIN of the data reproduction circuit 10.

In the data reproduction circuit 10, a comparison voltage (threshold voltage) variable circuit 20 is formed by the peak hold circuit 12, the reference voltage source 13, the operational amplifier (Op Amp) 14, and the adder 15.

The comparator 11 obtains reproduced data VOUT output depending on the result of comparison between input data VIN' that is supplied to one input and is input to the input node ND10 after the capacitive coupling and a comparison voltage VVAREF as a threshold supplied to the other input.

The comparison voltage VVAREF is obtained by the adder 15 as a threshold voltage resulting from varying a second reference voltage VREF depending on the difference between a first reference voltage VREFP and a voltage P/HO obtained by peak hold.

The peak hold circuit 12 generates the voltage P/HO obtained by holding the peak value of the input data VIN' input to the input node ND10.

The voltage P/HO obtained by the peak hold by the peak hold circuit 12 is supplied to the non-inverting input terminal (+) of the operational amplifier 14 and the first reference voltage VREFP by the reference voltage source 13 is supplied to the inverting input terminal (−).

The operational amplifier 14 generates a voltage (signal) V14 depending on the difference between the peak hold voltage P/HO and the first reference voltage VREFP and outputs this voltage V14 to the adder 15.

The adder 15 adds the voltage V14 by the operational amplifier 14 to the second reference voltage VREF as the basic threshold voltage and supplies the resulting voltage as the comparison voltage VVAREF to the other input of the comparator 11.

In the present embodiment, the second reference voltage VREF is changed along the mark rate of the input data. The reason for this is as follows.

For easy understanding, the timing diagram of FIG. 7 uses a data string that is switched to a data string with a low mark rate subsequently to continuation of H (high) data and then switched to a data string with a high mark rate in midstream.

As is understood from FIG. 7, the DC value of the input data VIN' resulting from AC coupling by the capacitor C10 greatly varies depending on the mark rate.

Therefore, if the second reference voltage VREF, which is a constant voltage, is used as the comparison voltage of the comparator 11, an error occurs at part where the DC variation is large.

To address this, the second reference voltage VREF is changed along the mark rate of the input data in the present embodiment.

In the data reproduction circuit 10 of the present first embodiment, first the voltage P/HO obtained by peak hold of the input data VIN' is generated and the comparison voltage VVAREF of the comparator 11 is changed depending on the difference between this voltage and the first reference voltage VREFP.

In the example shown in FIG. 7, a data format in which the interval having no data is fixed to "H" like e.g. a universal asynchronous receiver transmitter (UART) is employed as an example.

Furthermore, in the present example, the second reference voltage VREF as the basic comparison voltage of the comparator 11 is set somewhat low in advance so that "H" can be reproduced.

When a data string with a low mark rate comes subsequently to "H," the DC level falls down immediately after the start of the data and then gradually rises up based on the time constant of the coupling capacitance and internal resistance.

In the case of the UART, the mark rate is about 20% to 100% because of the existence of start bit and stop bit, and the case in which "H" does not reach for a long period does not exist.

According to the present first embodiment, there is no need to limit the mark rate of data to be transmitted or perform data conversion for the AC-coupled transmission line. Therefore, a wide variety of transmission systems can be realized with a simple configuration.

In other words, according to the present first embodiment, data reproduction can be stably performed with suppression of increase in the complexity of the configuration in data transmission via AC coupling.

2. Second Embodiment

Figure 8:
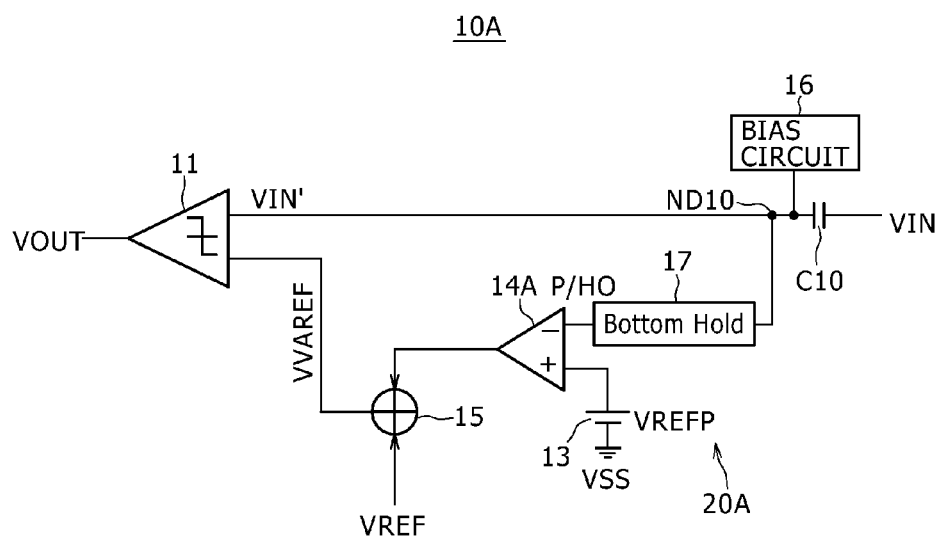
FIG. 8 is a circuit diagram showing a data reproduction circuit according to a second embodiment.

FIG. 8 is a circuit diagram showing a data reproduction circuit according to the present second embodiment.

Figure 9:
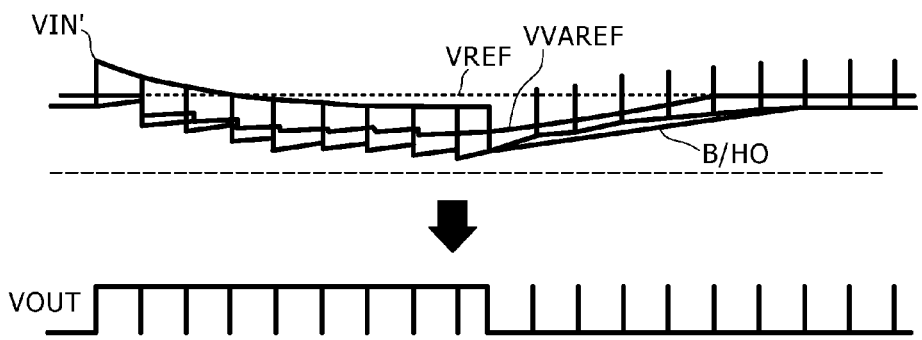
FIG. 9 is a timing chart of the data reproduction circuit of FIG. 8.

FIG. 9 is a timing chart of the data reproduction circuit of FIG. 8.

The difference of a data reproduction circuit 10A according to the present second embodiment from the data reproduction circuit 10 according to the first embodiment is as follows.

The present data reproduction circuit 10A changes the comparison voltage VVAREF as the threshold voltage of the comparator 11 depending on the differential voltage between a voltage B/HO obtained by not peak hold but bottom hold of the input data VIN' and the first reference voltage VREFP.

In the data reproduction circuit 10A, the voltage B/HO obtained by the bottom hold by a bottom hold circuit 17 is supplied to the inverting input terminal (−) of an operational amplifier 14A and the first reference voltage VREFP by the reference voltage source 13 is supplied to the non-inverting input terminal (+).

In the data reproduction circuit 10A, a comparison voltage (threshold voltage) variable circuit 20A is formed by the bottom hold circuit 17, the reference voltage source 13, the operational amplifier (Op Amp) 14A, and the adder 15.

For easy understanding, the timing diagram of FIG. 9 uses a data string that is switched to a data string with a high mark rate subsequently to continuation of L (low) data and then switched to a data string with a low mark rate in midstream.

Also in this case, as is understood from FIG. 9, the DC value of the input data VIN' resulting from AC coupling by the capacitor C10 greatly varies depending on the mark rate.

Therefore, if the second reference voltage VREF, which is a constant voltage, is used as the comparison voltage of the comparator 11, an error occurs at part where the DC variation is large.

In the data reproduction circuit 10A of the present second embodiment, first the voltage B/HO obtained by bottom hold of the input data VIN' is generated and the comparison voltage VVAREF of the comparator 11 is changed depending on the difference between this voltage and the first reference voltage VREFP.

In the example shown in FIG. 9, a data format in which the interval having no data is fixed to "L" contrary to e.g. the above-described data format is employed as an example.

Furthermore, in the present example, the second reference voltage VREF as the basic comparison voltage of the comparator 11 is set somewhat high in advance so that "L" can be reproduced.

When a data string with a high mark rate comes subsequently to "L," the DC level rises up immediately after the start of the data and then gradually falls down based on the time constant of the coupling capacitance and internal resistance.

In the case of the UART, the mark rate is 0% to about 80% because of the existence of start bit and stop bit, and the case in which "L" does not reach for a long period does not exist.

According to the present second embodiment, advantageous effects can be achieved similarly to the above-described first embodiment.

Specifically, according to the second embodiment, there is no need to limit the mark rate of data to be transmitted or perform data conversion for the AC-coupled transmission line. Therefore, a wide variety of transmission systems can be realized with a simple configuration.

In other words, according to the present second embodiment, data reproduction can be stably performed with suppression of increase in the complexity of the configuration in data transmission via AC coupling.

As shown in the first embodiment and the second embodiment above, stable data can be reproduced irrespective of the mark rate of the data string by varying the comparison voltage of the comparator 11 depending on the mark rate of the data string.

3. Third Embodiment

Figure 10:
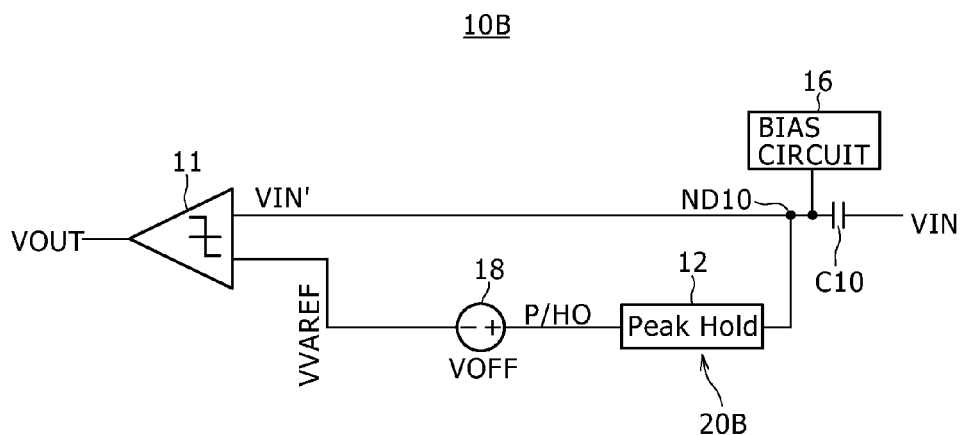
FIG. 10 is a circuit diagram showing a data reproduction circuit according to a third embodiment.

FIG. 10 is a circuit diagram showing a data reproduction circuit according to the present third embodiment.

The difference of a data reproduction circuit 10B according to the present third embodiment from the data reproduction circuit 10 according to the first embodiment is as follows.

The present data reproduction circuit 10B varies the comparison voltage VVAREF of the comparator 11 by simply adding a fixed offset voltage VOFF to the peak hold voltage P/HO by an offset voltage adder 18.

In the first embodiment, the comparison voltage VVAREF of the comparator 11 is generated depending on the differential voltage between the voltage obtained by peak hold and the first reference voltage VREFP.

However, when mark rate variation of the data string is small, it is enough to simply add the fixed offset voltage VOFF to the voltage obtained by peak hold like the present third embodiment.

In the data reproduction circuit 10B, a comparison voltage (threshold voltage) variable circuit 20B is formed by the peak hold circuit 12 and the offset voltage adder 18.

According to the present third embodiment, advantageous effects can be achieved similarly to the above-described first embodiment.

4. Fourth Embodiment

Figure 11:
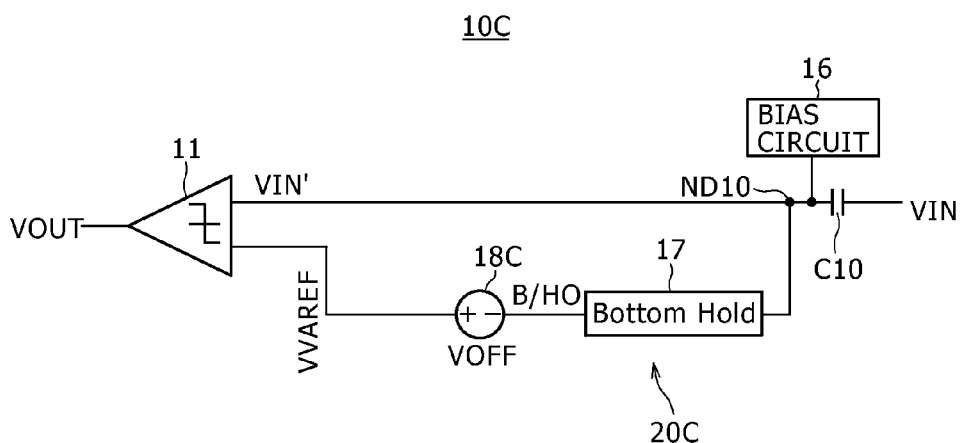
FIG. 11 is a circuit diagram showing a data reproduction circuit according to a fourth embodiment.

FIG. 11 is a circuit diagram showing a data reproduction circuit according to the present fourth embodiment.

The difference of a data reproduction circuit 10C according to the present fourth embodiment from the data reproduction circuit 10A according to the second embodiment is as follows.

The present data reproduction circuit 10C varies the comparison voltage VVAREF of the comparator 11 by simply adding the fixed offset voltage VOFF to the bottom hold voltage B/HO by an offset voltage adder 18C.

In the second embodiment, the comparison voltage VVAREF of the comparator 11 is generated depending on the differential voltage between the voltage obtained by bottom hold and the first reference voltage VREFP.

However, when mark rate variation of the data string is small, it is enough to simply add the fixed offset voltage VOFF to the voltage obtained by bottom hold like the present fourth embodiment.

In the data reproduction circuit 10C, a comparison voltage (threshold voltage) variable circuit 20C is formed by the bottom hold circuit 17 and the offset voltage adder 18C.

According to the present fourth embodiment, advantageous effects can be achieved similarly to the above-described first and second embodiments.

As described above, in both the first embodiment and the second embodiment, the comparison voltage VVAREF of the comparator 11 is generated depending on the differential voltage between the voltage obtained by peak hold or bottom hold and the first reference voltage VREFP.

However, when mark rate variation of the data string is small, it is enough to simply add the fixed offset voltage VOFF to the voltage obtained by peak hold or bottom hold like the third embodiment or the fourth embodiment.

5. Fifth Embodiment

Figure 12:
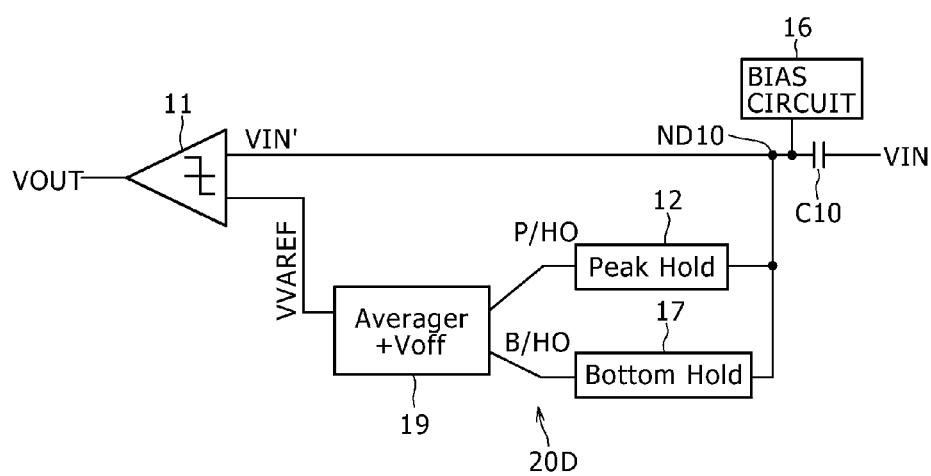
FIG. 12 is a circuit diagram showing a data reproduction circuit according to a fifth embodiment.

FIG. 12 is a circuit diagram showing a data reproduction circuit according to the present fifth embodiment.

Figure 13:
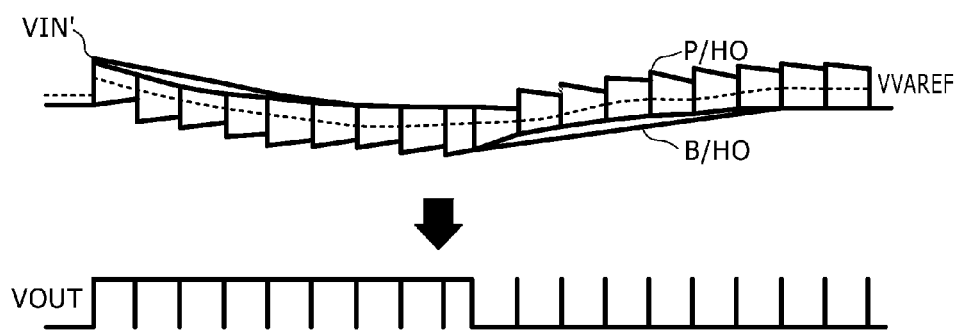
FIG. 13 is a timing chart of the data reproduction circuit of FIG. 12.

FIG. 13 is a timing chart of the data reproduction circuit of FIG. 12.

Basically, a data reproduction circuit 10D according to the present fifth embodiment generates the average value of the voltage P/HO obtained by peak hold and the voltage B/HO obtained by bottom hold as the comparison voltage VVAREF of the comparator 11.

In the present data reproduction circuit 10D, the output voltage P/HO of the peak hold circuit 12 and the output voltage B/HO of the bottom hold circuit 17 are input to an averager and offset voltage adder 19.

The averager and offset voltage adder 19 obtains the average value of the voltage P/HO obtained by peak hold and the voltage B/HO obtained by bottom hold.

Furthermore, in the present data reproduction circuit 10D, the offset voltage VOFF is added to the obtained average value in the averager and offset voltage adder 19 and the resulting voltage is generated as the comparison voltage VVAREF of the comparator 11.

In the averager and offset voltage adder 19, e.g. for an input format in which the interval having no data is "L," a positive offset voltage is added to the average value.

For an input format in which the interval having no data is "H," a negative offset is added to the average value.

In the data reproduction circuit 10D, a comparison voltage (threshold voltage) variable circuit 20D is formed by the peak hold circuit 12, the bottom hold circuit 17, and the averager and offset voltage adder 19.

Also in the present fifth embodiment, there is no need to limit the mark rate of data to be transmitted or perform data conversion for the AC-coupled transmission line. Therefore, a wide variety of transmission systems can be realized with a simple configuration.

6. Sixth Embodiment

A data transmission device to which the data reproduction circuit according to the sixth embodiment is applied will be described below.

FIG. 14 is a circuit diagram showing the data transmission device to which the data reproduction circuit according to the sixth embodiment is applied.

The present data transmission device 100A includes a first transmitter/receiver 200A, a transmission line 300, and a second transmitter/receiver 400A.

In the present sixth embodiment, a signal transmitted from the first transmitter/receiver 200A to the second transmitter/receiver 400A via the transmission line 300 is referred to as a downstream signal DS and a signal transmitted from the second transmitter/receiver 400A to the first transmitter/receiver 200A via the transmission line 300 is referred to as an upstream signal US.

The first transmitter/receiver 200A has an output circuit 210 of transmission data/reference clock signal in the first transmitter/receiver 200A and an upstream signal receiver 220.

The second transmitter/receiver 400A has a clock reproduction circuit 410 in the second transmitter/receiver 400A and a downstream signal receiver 430.

The transmission line 300 is configured by a pair of signal lines LSGN1 and LSGN2.

In the transmission line 300, capacitors C11 and C12 for AC coupling to block the DC component and allow the passage of the AC signal are inserted in the signal lines LSGN1 and LSGN2 on the side of connection to the first transmitter/receiver 200A.

In the transmission line 300, capacitors C21 and C22 for AC coupling to block the DC component and allow the passage of the AC signal are inserted in the signal lines LSGN1 and LSGN2 on the side of connection to the second transmitter/receiver 400A.

Moreover, in the transmission line 300, capacitors C31 and C32 for AC coupling to block the DC component and allow the passage of the AC signal are inserted at the connection part to the receiver end of the second transmitter/receiver 400A.

In the data transmission device 100A, basically a high-speed downstream signal is transmitted from the first transmitter/receiver 200A by the pair of AC-coupled transmission lines 300. Furthermore, the data transmission device 100A permits simultaneous, parallel transmission of two or more kinds of upstream signals such as a reference clock request signal and a user signal from the second transmitter/receiver 400A.

The data transmission device 100A transmits a common-mode signal as two or more kinds of upstream signals in such a manner that one of the signals is transmitted with only a single phase (positive phase or reverse phase) and the other is transmitted with both phases (positive phase and reverse phase).

The data transmission device 100A of the present embodiment transmits the reference clock request signal with the single phase and transmits the user signal with both phases.

For upstream communication, the upstream signal receiver of the first transmitter/receiver 200A includes a function to separate two or more kinds of communication in association with the voltage difference between the positive phase and the reverse phase.

Because data resulting from AC coupling loses DC information, there is a limit to the width of pulse that can be transmitted.

In the data transmission device 100A of the present embodiment, in order to separate the upstream signal US from the downstream signal DS, a differential signal is transmitted for downstream communication and a common-mode signal is transmitted for upstream communication.

Furthermore, as the upstream signal US, the second transmitter/receiver 400A transmits the single-phase reference clock request signal when synchronization is not established, and transmits the both-phase user signal such as control information from the user when synchronization is established.

The output circuit 210 of the first transmitter/receiver 200A includes a D flip-flop 211, a selector 212, a frequency divider 213, and a differential driver 214.

The upstream signal receiver 220 has a differential voltage detection circuit 221, a first comparator 222, a common-mode voltage detection circuit 223, a second comparator 224, a threshold voltage (comparison voltage) variable circuit 225, and a gate 226.

A data reproduction circuit 230 is formed by the common-mode voltage detection circuit 223, the second comparator 224, and the threshold voltage (comparison voltage) variable circuit 225.

In FIG. 14, both the transmitter side and the receiver side of both upstream communication and downstream communication of the data transmission device 100A are shown as described above, and the data reproduction circuit 230 according to the present embodiment is disposed on the receiver side of the upstream communication.

The data transmission device 100A is AC-coupled on the transmission line 300 by the capacitors C11, C12, C21, and C22.

In upstream communication, a signal with speed sufficiently lower than that of the signal for downstream communication is treated. Furthermore, upstream communication and downstream communication are separated from each other by transmitting a common-mode signal for upstream communication and transmitting a differential signal for downstream communication.

In the upstream signal receiver 220 of the data transmission device 100A, the differential signal is canceled by an adder 2231 of the common-mode voltage detection circuit 223 to extract only the common-mode component and unnecessary high-frequency components are removed by a low-pass filter (LPF) 2232.

Then, an output voltage UPDAL of the common-mode voltage detection circuit 223 is input to the comparator 224 and the threshold voltage (comparison voltage) variable circuit 225.

Using the present circuit can provide a data transmission system in which it is unnecessary to limit the mark rate or turn data to a balanced code for the upstream communication.

The respective configurations and functions of the first transmitter/receiver 200A will be described below.

In the output circuit 210, a transmission clock signal TCK from a transmission clock generating circuit (not shown) is input to a clock signal input terminal of the flip-flop 211 and serial transmission data SDATA from a parallel/serial conversion circuit (not shown) is input to a data input terminal.

The flip-flop 211 sequentially outputs the transmission data at the timing of the clock signal TCK and this output data is input to an input terminal T0 of the selector 212.

The frequency divider 213 divides the frequency of the transmission clock signal TCK by N (N is a positive integer)

and inputs the divided signal as a reference clock signal TCK/N to an input terminal T1 of the selector 212.

The selector 212 selects the signal input to either the input terminal T0 or the input terminal T1 and outputs it in accordance with the level of a selection control signal REFREQ input to a selection signal terminal S.

For example, when the selection control signal at a high level H is input to the selection signal terminal S, the selector 212 selects the signal input to the input terminal T1 and outputs it. Conversely, when the selection control signal at a low level L is input to the selection signal terminal S, the selector 212 selects the signal input to the input terminal T0 and outputs it.

The selection control signal REFREQ is an output signal of the first comparator 222.

When the selection control signal REFREQ is at the high level H, it is deemed that the reference clock request signal is received and the reference clock signal TCK/N of the transmission clock signal is selected in the selector 212.

When the selection control signal REFREQ is at the low level L, it is deemed that the reference clock request signal is not received and the transmission data SDATA is selected in the selector 212.

The differential driver 214 receives the output signal of the selector 212 to generate paired differential signals in response to this and output them to the transmission line 300 composed of the pair of signal lines LSGN1 and LSGN2.

In the upstream signal receiver 220, the differential voltage detection circuit 221 detects the voltage difference between the positive phase and the reverse phase of the received upstream signal US and determines whether the upstream signal US is the reference clock request signal or the user signal. The differential voltage detection circuit 221 outputs a signal S221 at the level depending on the determination result to the first comparator 222.

If the upstream signal US is the user signal, the differential voltage thereof is zero because it is a both-phase signal. In this case, the differential voltage detection circuit 221 outputs the signal S221 at an almost zero level.

If the upstream signal US is the reference clock request signal, a differential voltage is generated between the positive phase and the reverse phase because it has only a single phase. In this case, the differential voltage detection circuit 221 outputs the signal S221 at the high level higher than a threshold voltage DVREF1.

The first comparator 222 compares the level of the determination signal S221 of the differential voltage detection circuit 221 with the level of the threshold voltage DVREF1 set in advance.

If the level of the determination signal S221 is higher than that of the threshold voltage DVREF1, the first comparator 222 deems that the reference clock request signal is received and outputs the selection control signal REFREQ at the high level H to the selector 212 and the gate 226.

If the level of the determination signal S221 is equal to or lower than that of the threshold voltage DVREF1, the first comparator 222 deems that the reference clock request signal is not received and outputs the selection control signal REFREQ at the low level L to the selector 212 and the gate 226.

When the reference clock is requested, an upstream signal output UPDAO is masked by the gate 226 because the selection control signal REFREQ is at the high level H.

When a common-mode signal is applied to the transmission line 300, the common-mode voltage detection circuit 223 detects it and outputs it to the second comparator 224 and the threshold voltage (comparison voltage) variable circuit 225.

As described above, the common-mode voltage detection circuit 223 cancels the differential signal by the adder 2231 to extract only the common-mode component and removes unnecessary high-frequency components by the LPF 2232.

The threshold voltage (comparison voltage) variable circuit 225 includes the configuration explained in association with the above-described first to fifth embodiments.

The threshold voltage (comparison voltage) variable circuit 225 can reproduce stable data irrespective of the mark rate of the data string by varying the comparison voltage of the second comparator 224 depending on the mark rate of the data string.

Detailed description thereof is omitted here.

The second comparator 224 compares the detection signal UPDAL from the common-mode voltage detection circuit 223 with the comparison voltage VVAREF and outputs the comparison result as the upstream data UPDAO to the gate 226.

In the output circuit 210 configured in the above-described manner, in normal operation, only a differential signal exists on the transmission line 300 and the signal S221 at the low level is output by the differential voltage detection circuit 221.

Thereby, the selection control signal REFREQ at the low level is output from the first comparator 222 to be input to the selection signal terminal S of the selector 212.

In accordance with this, the signal input to the input terminal T0 is selected by the selector 212. Specifically, the serial transmission data SDATA output from the flip-flop 211 is selected by the selector 212 to be output to the transmission line 300.

On the other hand, when the PLL (phase locked loop) circuit becomes out of synchronization attributed to any cause in the second transmitter/receiver 400A, a request signal for the reference clock signal as a common-mode signal is generated and output to the transmission line 300 by the clock reproduction circuit 410 of the second transmitter/receiver 400A.

In response to this, in the upstream signal receiver 220 of the first transmitter/receiver 200A, the detection signal at the high level is generated by the differential voltage detection circuit 221 and the selection control signal REFREQ at the high level is output from the first comparator 222.

This selection control signal REFREQ at the high level is input to the selection signal terminal S of the selector 212. In accordance with this, the signal input to the input terminal T1 is selected by the selector 212.

Specifically, the reference clock signal TCK/N output from the frequency divider 213 is selected by the selector 212 to be output to the transmission line 300 via the differential driver 214.

As shown in the diagram, the clock reproduction circuit 410 of the second transmitter/receiver 400A has a voltage-controlled oscillator (VCO) 411, a loop filter 412, a phase detector (PD) 413, a phase frequency detector (PFD) 414, and frequency dividers 415 and 416.

The clock reproduction circuit 410 has a synchronization detection circuit 417, a differential driver 418, a selector 419, a common-mode driver 420 as a buffer, and a switch 421.

The division ratio of the frequency divider 415 is set equal to that of the frequency divider 213 in the first transmitter/receiver 200A. Furthermore, both the division ratios of these frequency dividing circuits can be set to 1. That is, these frequency dividers can be omitted.

By providing the frequency dividers 213 and 415 in the first transmitter/receiver 200A and the second transmitter/receiver 400A, respectively, the frequency of the reference clock signal RCK (TCK/N) can be reduced and the operating frequency range of the phase frequency detector 414 of the second transmitter/receiver 400A can be decreased.

The downstream signal receiver 430 has a differential receiver 431 and a D flip-flop 432.

A PLL circuit 440 is configured by the phase detector 413, the phase frequency detector 414, the loop filter 412, and the VCO 411.

The phase detector 413 compares the phase of the downstream signal DS (S431) as a reception signal from the differential receiver 431 with the phase of a clock signal LCK from the VCO 411 and generates an oscillation control signal S413 depending on the comparison result to output it to the loop filter 412.

FIG. 15 is a circuit diagram showing one configuration example of the phase detector 413.

As shown in FIG. 15, the phase detector 413 of the present example is configured by a phase comparator 4131 and a lock detector 4132.

The phase comparator 4131 compares the phase of the clock signal LCK generated by the VCO 411 with the phase of the transmitted signal from the transmission line 300 and outputs the oscillation control signal S413 depending on the comparison result.

The lock detector 4132 generates a lock detection signal S4132 indicating the synchronization state of the clock signal LCK and outputs it to the synchronization detection circuit 417.

It is also possible to provide the lock detector 4132 separately from the phase detector 413.

The phase frequency detector 414 compares the frequency of the frequency-divided signal from the frequency divider 415 with the frequency of the reference clock signal TCK/N (RCK) transmitted from the transmission line 300 and outputs an oscillation control signal S414 depending on the comparison result.

The loop filter 412 removes high-frequency components, noise, and so forth of the oscillation control signal S413 from the phase detector 413 or the oscillation control signal S414 from the phase frequency detector 414 and outputs only low-frequency components to the VCO 411.

The VCO 411 receives an oscillation control signal S412 from the loop filter 412 and controls the frequency of the clock signal LCK in accordance with it.

In the PLL circuit 440 configured in this manner, the clock signal LCK (TCK) having the same frequency as that of the transmission clock signal TCK used by the first transmitter/receiver 200A is obtained by the VCO 411.

The clock signal LCK is used for reception of transmission data or synchronization control of the second transmitter/receiver 400A as a reproduction signal of the transmission clock signal TCK.

In reception, the differential receiver 431 receives a differential signal transmitted from the transmission line 300 to generate the reception signal S431 in response to this and output it to each of the phase detector 413, the phase frequency detector 414, and the flip-flop 432.

The phase detector 413 and the phase frequency detector 414 are provided with an enable signal terminal and the operating/non-operating state thereof is set depending on the level of an input enable signal.

Here, suppose that both the phase detector 413 and the phase frequency detector 414 are low-level enabled circuits. That is, they operate only when a low-level signal is input to the enable signal terminal and do not operate at any other time.

Enable signals EN1 and EN2 to control the operation state of the phase detector 413 and the phase frequency detector 414 are generated by the differential driver 418. The lock detector 4132 in the phase detector 413 is set to the operating state irrespective of the enable signal EN1 input to the phase detector 413.

In normal operation, the enable signal EN1 at the low level and the enable signal EN2 at the high level are generated by the differential driver 418. Thus, only the phase detector 413 is set to the operating state and the phase frequency detector 414 is set to the non-operating state.

In the second transmitter/receiver 400A, in the initialization state or in normal reception operation, the frequency of the clock signal LCK generated by the VCO 411 often greatly deviates from the frequency of the clock signal TCK used by the first transmitter/receiver 200A attributed to any cause.

At this time, e.g. the lock detection signal at the low level indicating the frequency deviation is generated and output to the synchronization detection circuit 417 by the lock detector 4132 provided in the phase detector 413.

The synchronization detection circuit 417 generates a synchronization control signal LOCK (S417) in response to the lock detection signal S4132 from the lock detector 4132.

For example, when receiving the lock detection signal S4132 at the low level from the lock detector 4132, the synchronization detection circuit 417 generates the synchronization control signal LOCK at the low level L and outputs it to each of the differential driver 418, the selector 419, and the switch 421.

The synchronization control signal LOCK is e.g. a pulse signal having a certain time width.

Upon receiving the synchronization control signal LOCK, the differential driver 418 generates the enable signal EN1 at the high level and the enable signal EN2 at the low level and outputs them to the phase detector 413 and the phase frequency detector 414, respectively.

In response to this, the phase detector 413 is set to the non-operating state and the phase frequency detector 414 is set to the operating state.

If the synchronization control signal LOCK by the synchronization detection circuit 417, supplied to a selection signal terminal S of the selector 419, is at the high level H, the selector 419 deems that synchronization is established, and selects the user signal as an upstream signal US2 to output it to the common-mode driver 420.

If the synchronization control signal LOCK is at the low level L, the selector 419 deems that synchronization is not established, and selects the reference clock request signal as an upstream signal US1 resulting from frequency division of the clock signal LCK by the frequency dividers 415 and 416 to output it to the common-mode driver 420.

As the user signal, a data format in which the interval having no data is fixed to "High" like e.g. a UART is assumed. The comparison voltage VVAREF of the second comparator 224 of the upstream signal receiver 220, which is variably controlled as described above, is basically set somewhat low so that "High" can be recognized.

In the case of a data format in which the interval having no data is "Low," conversely the comparison voltage VVAREF is set somewhat high so that "Low" can be recognized.

The reference clock request signal is a clock signal resulting from frequency division of the output of the VCO 411 in the PLL circuit 440. This clock signal is the free-running clock of the VCO 411 when synchronization is not established.

A common-mode signal is generated and output to the transmission line 300 by the common-mode driver 420.

At this time, if the synchronization control signal LOCK is at the high level H, the switch 421 is turned on and the user signal selected by the selector 419 is transmitted to the transmission line 300 as a both-phase signal (positive phase and reverse phase).

At this time, the average voltage of the pair of signal lines configuring the transmission line 300 is kept at the high level, specifically e.g. 1 V.

If the synchronization control signal LOCK is at the low level L, the switch 421 is turned off and the reference clock request signal selected by the selector 419 is transmitted to the transmission line 300 as a single-phase signal (positive phase or reverse phase).

When a single-phase signal is being output to the transmission line 300, in the upstream signal receiver 220 of the first transmitter/receiver 200A, the detection signal S221 at the high level is output by the differential voltage detection circuit 221. As a result, the selection control signal REFREQ at the high level is output by the first comparator 222.

In accordance with this, by the selector 212, the reference clock TCK/N (RCK) from the frequency divider 213 is selected and output to the transmission line 300 via the differential driver 214.

When this reference clock is requested, the upstream signal output UPDAO is masked by the gate 226 because the selection control signal REFREQ is at the high level H.

In the downstream signal receiver 430 of the second transmitter/receiver 400A, the reception signal S431 synchronized with the reference clock TCK/N (RCK) is output by the differential receiver 431.

This signal is input to the phase frequency detector 414 set to the operating state by the enable signal EN2 at the low level. Furthermore, the frequency of the clock signal LCK output by the VCO 411 is divided by N by the frequency divider 415 and the divided signal is also input to the phase frequency detector 414.

By the phase frequency detector 414, the frequency of the reception signal S431 is compared with that of the divided signal from the frequency divider 415 and the oscillation control signal S414 is generated depending on the comparison result to be output to the loop filter 412.

By the loop filter 412, high-frequency components, noise, and so forth of the oscillation control signal S414 from the phase frequency detector 414 are removed and only low-frequency components are output to the VCO 411.

Then, in the VCO 411, the frequency of the clock signal LCK is controlled in accordance with the oscillation control signal S412 from the loop filter 412.

By this control, the oscillation frequency of the VCO 411 is so controlled that the frequency of the divided signal from the frequency divider 415 corresponds with that of the reference clock TCK/N (RCK).

Thereby, the frequency of the clock signal LCK generated by the VCO 411 corresponds with that of the transmission clock signal TCK used by the first transmitter/receiver 200A.

When the frequencies correspond with each other, the lock detection signal S4132 at the high level is generated and output to the synchronization detection circuit 417 by the lock detector 4132 provided in the phase detector 413.

In response to this, the synchronization control signal LOCK at the high level is output by the synchronization detection circuit 417. Thus, the signal selected by the selector 419 is switched from the reference clock request signal to the user signal and the generation of the single-phase signal by the common-mode driver 420 is stopped. At this time, the switch 421 is turned on.

Thereby, the detection signal S221 at the low level is output by the differential voltage detection circuit 221 of the first transmitter/receiver 200A, and the selection control signal REFREQ at the low level is generated and input to the selection signal terminal S of the selector 212 by the first comparator 222.

As a result, the output signal to the transmission line 300 is switched from the reference clock signal TCK/N to the transmission data SDATA by the selector 212.

Furthermore, if the synchronization control signal LOCK is at the high level H, when the switch 421 is turned on and the user signal selected by the selector 419 is transmitted to the transmission line 300 as a both-phase signal (positive phase and reverse phase), the following processing is executed in the first transmitter/receiver 200A.

Because the common-mode signal is applied to the transmission line 300, the common-mode voltage detection circuit 223 detects it and outputs it to the second comparator 224.

The second comparator 224 compares the detection signal UPDAL from the common-mode voltage detection circuit 223 with the comparison voltage VVAREF varied by the threshold voltage (comparison voltage) variable circuit 225 and outputs the comparison result as the upstream data UPDAO through the gate 226.

In the clock reproduction circuit 410 of the second transmitter/receiver 400A, by the differential driver 418, the enable signal EN1 at the low level and the enable signal EN2 at the high level are generated and output to the phase detector 413 and the phase frequency detector 414, respectively.

Thereby, the phase frequency detector 414 is switched to the non-operating state and the phase detector 413 is switched to the operating state.

Specifically, when the frequency of the clock signal LCK generated by the VCO 411 corresponds with that of the transmission clock signal TCK used by the first transmitter/receiver 200A, the PLL circuit configured by the phase detector 413, the loop filter 412, and the VCO 411 operates.

Furthermore, control is so carried out that the phase of the clock signal LCK generated by the VCO 411 corresponds with that of the reception signal S431 output from the differential receiver 431.

Moreover, the data SDATA transmitted from the transmission line 300 is sequentially output by the flip-flop 432 in accordance with the timing of the clock signal LCK generated by the VCO 411.

The output data SDATA of the flip-flop 432 is converted to e.g. n-bit data and output by a serial/parallel conversion circuit in the second transmitter/receiver 400A.

By the above-described operation, the data transmitted from the first transmitter/receiver 200A is accurately received by the second transmitter/receiver 400A.

The following processing is executed when the frequency of the clock signal LCK of the second transmitter/receiver 400A deviates from that of the transmission clock signal TCK used by the first transmitter/receiver 200A attributed to e.g. noise at the time of initialization or in normal data transmission.

By the clock reproduction circuit 410, a signal to request transmission of the reference clock signal RCK is selected by the selector 419 and a common-mode signal is output to the common-mode driver 420. This signal is output to the transmission line 300 as a single-phase signal because the switch 421 is in the off-state.

In the upstream signal receiver 220 of the first transmitter/receiver 200A, the reference clock request signal as the single-phase signal is detected. In response to this, the transmission signal is switched to the reference clock signal TCK/N (RCK) by the selector 212 to be output to the transmission line 300.

In the second transmitter/receiver 400A, the oscillation frequency is controlled by the PLL circuit configured by the phase frequency detector 414, the loop filter 412, and the VCO 411 until the frequency of the divided signal of the frequency divider 415 corresponds with that of the reference clock signal RCK.

When the frequencies correspond with each other, the generation of the reference clock request signal is stopped and the transmission signal is switched to the normal transmission data SDATA in the first transmitter/receiver 200A.

In parallel to this, in the clock reproduction circuit 410, the clock signal LCK having the same frequency as that of the transmission clock signal TCK used by the first transmitter/receiver 200A is generated by the PLL circuit configured by the phase detector 413, the loop filter 412, and the VCO 411. Based on this, the data transmitted by the transmission line 300 is received.

As described above, the following advantageous effects can be achieved according to the present sixth embodiment.

Two or more kinds of signals can be transmitted as upstream communication in conjunction with downstream communication by a pair of AC-coupled data transmission lines.

That is, the present embodiment enables two or more kinds of upstream communication by the AC-coupled transmission lines with a simple configuration and can respond to diversification of the system.

Furthermore, a wide range of the transmission rate can be covered and the PLL circuit can be rapidly locked to the transmission clock. In addition, an effective clock reproduction circuit can be realized with a simple circuit configuration without the need to increase a transmission medium.

Moreover, there is no need to limit the mark rate of data to be transmitted or perform data conversion for the AC-coupled transmission line. Therefore, a wide variety of transmission systems can be realized with a simple configuration.

In other words, according to the present sixth embodiment, data reproduction can be stably performed with suppression of increase in the complexity of the configuration in data transmission via AC coupling.

7. Seventh Embodiment

Figure 16:
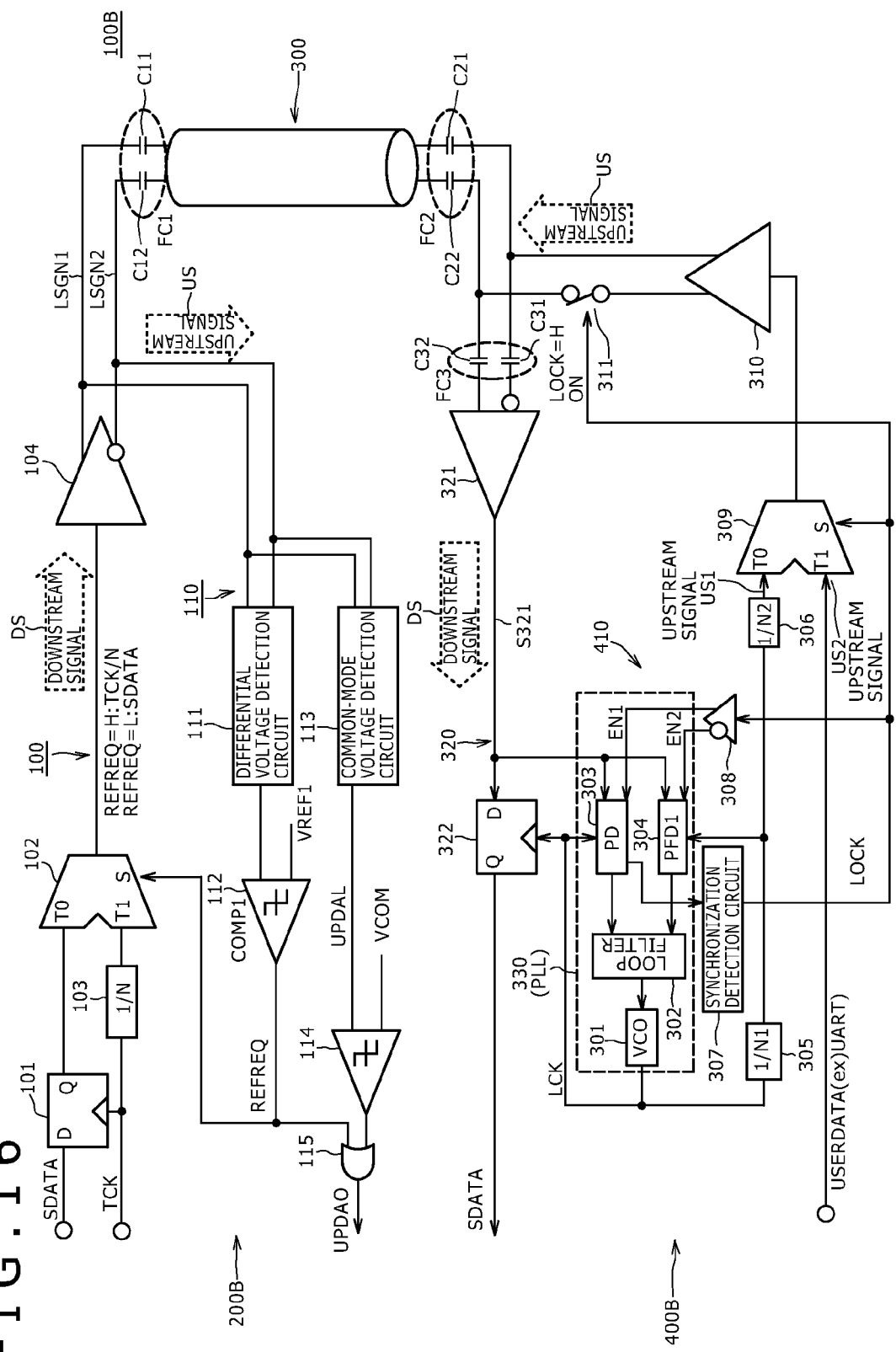
FIG. 16 is a circuit diagram showing a data transmission device according to a seventh embodiment.

FIG. 16 is a circuit diagram showing a data transmission device according to the present seventh embodiment.

The present data transmission device 100B includes a first transmitter/receiver 200B, the transmission line 300, and a second transmitter/receiver 400B.

In the present embodiment, a signal transmitted from the first transmitter/receiver 200B to the second transmitter/receiver 400B via the transmission line 300 is referred to as the downstream signal DS and a signal transmitted from the second transmitter/receiver 400B to the first transmitter/receiver 200B via the transmission line 300 is referred to as the upstream signal US.

The first transmitter/receiver 200B has an output circuit 100 of transmission data/reference clock signal in the first transmitter/receiver 200B and an upstream signal receiver 110.

The second transmitter/receiver 400B has the clock reproduction circuit 410 in the second transmitter/receiver 400B and a downstream signal receiver 320.

The transmission line 300 is configured by the pair of signal lines LSGN1 and LSGN2.

In the transmission line 300, the capacitors C11 and C12 for AC coupling to block the DC component and allow the passage of the AC signal are inserted in the signal lines LSGN1 and LSGN2 on the side of connection to the first transmitter/receiver 200B.

In the transmission line 300, the capacitors C21 and C22 for AC coupling to block the DC component and allow the passage of the AC signal are inserted in the signal lines LSGN1 and LSGN2 on the side of connection to the second transmitter/receiver 400B.

Moreover, in the transmission line 300, the capacitors C31 and C32 for AC coupling to block the DC component and allow the passage of the AC signal are inserted at the connection part to the receiver end of the second transmitter/receiver 400B.

In the data transmission device 100B, basically a high-speed downstream signal can be transmitted from the first transmitter/receiver 200B by the pair of AC-coupled transmission lines 300 and two or more kinds of upstream signals such as the reference clock request signal and the user signal can be transmitted from the second transmitter/receiver 400B simultaneously in parallel.

The data transmission device 100B transmits a common-mode signal as two or more kinds of upstream signals in such a manner that one of the signals is transmitted with only a single phase (positive phase or reverse phase) and the other is transmitted with both phases (positive phase and reverse phase).

The data transmission device 100B of the present embodiment transmits the reference clock request signal with the single phase and transmits the user signal with both phases.

For upstream communication, the upstream signal receiver of the first transmitter/receiver 200B includes a function to separate two or more kinds of communication in association with the voltage difference between the positive phase and the reverse phase.

Because data resulting from AC coupling loses DC information, there is a limit to the width of pulse that can be transmitted.

In the data transmission device 100B of the present embodiment, in order to separate the upstream signal US from the downstream signal DS, a differential signal is transmitted for downstream communication and a common-mode signal is transmitted for upstream communication.

Furthermore, as the upstream signal US, the second transmitter/receiver 400B transmits the single-phase reference clock request signal when synchronization is not established, and transmits the both-phase user signal such as control information from the user when synchronization is established.

The output circuit 100 of the first transmitter/receiver 200B includes a D flip-flop 101, a selector 102, a frequency divider 103, and a differential driver 104.

The upstream signal receiver 110 has a differential voltage detection circuit 111, a first comparator 112, a common-mode voltage detection circuit 113, a second comparator 114, and a gate 115.

The transmission clock signal TCK from a transmission clock generating circuit (not shown) is input to a clock signal input terminal of the flip-flop 101 and the serial transmission data SDATA from a parallel/serial conversion circuit (not shown) is input to a data input terminal.

The flip-flop 101 sequentially outputs the transmission data at the timing of the clock signal TCK and this output data is input to an input terminal T0 of the selector 102.

The frequency divider 103 divides the frequency of the transmission clock signal TCK by N (N is a positive integer) and inputs the divided signal as the reference clock signal TCK/N to an input terminal T1 of the selector 102.

The selector 102 selects the signal input to either the input terminal T0 or the input terminal T1 and outputs it in accordance with the level of a selection control signal REFREQ input to a selection signal terminal S.

For example, when the selection control signal at a high level H is input to the selection signal terminal S, the selector 102 selects the signal input to the input terminal T1 and outputs it. Conversely, when the selection control signal at a low level L is input to the selection signal terminal S, the selector 102 selects the signal input to the input terminal T0 and outputs it.

The selection control signal REFREQ is an output signal of the first comparator 112.

When the selection control signal REFREQ is at the high level H, it is deemed that the reference clock request signal is received and the reference clock signal TCK/N of the transmission clock signal is selected in the selector 102.

When the selection control signal REFREQ is at the low level L, it is deemed that the reference clock request signal is not received and the transmission data SDATA is selected in the selector 102.

The differential driver 104 receives the output signal of the selector 102 to generate paired differential signals in response to this and output them to the transmission line 300 composed of the pair of signal lines LSGN1 and LSGN2.

The differential voltage detection circuit 111 detects the voltage difference between the positive phase and the reverse phase of the received upstream signal US and determines whether the upstream signal US is the reference clock request signal or the user signal. Furthermore, the differential voltage detection circuit 111 outputs a signal S111 at the level depending on the determination result to the first comparator 112.

If the upstream signal US is the user signal, the differential voltage thereof is zero because it is a both-phase signal. In this case, the differential voltage detection circuit 111 outputs the signal S111 at an almost zero level.

If the upstream signal US is the reference clock request signal, a differential voltage is generated between the positive phase and the reverse phase because it has only a single phase. In this case, the differential voltage detection circuit 111 outputs the signal S111 at the high level higher than a threshold voltage VREF1.

The first comparator 112 compares the level of the determination signal S111 of the differential voltage detection circuit 111 with the level of the threshold voltage VREF1 set in advance.

If the level of the determination signal S111 is higher than that of the threshold voltage VREF1, the first comparator 112 deems that the reference clock request signal is received and outputs the selection control signal REFREQ at the high level H to the selector 102 and the gate 115.

If the level of the determination signal S111 is equal to or lower than that of the threshold voltage VREF1, the first comparator 112 deems that the reference clock request signal is not received and outputs the selection control signal REFREQ at the low level L to the selector 102 and the gate 115.

When the reference clock is requested, an upstream signal output UPDAO is masked by the gate 115 because the selection control signal REFREQ is at the high level H.

When a common-mode signal is applied to the transmission line 300, the common-mode voltage detection circuit 113 detects it and outputs it to the second comparator 114.

The second comparator 114 compares a detection signal UPDAL from the common-mode voltage detection circuit 113 with a comparison voltage VCOM and outputs the comparison result as the upstream data UPDAO to the gate 115.

In the output circuit 100 configured in the above-described manner, in normal operation, only a differential signal exists on the transmission line 300 and the signal S111 at the low level is output by the differential voltage detection circuit 111.

Thereby, the selection control signal REFREQ at the low level is output from the first comparator 112 to be input to the selection signal terminal S of the selector 102.

In accordance with this, the signal input to the input terminal T0 is selected by the selector 102. Specifically, the serial transmission data SDATA output from the flip-flop 101 is selected by the selector 102 to be output to the transmission line 300.

On the other hand, when the PLL circuit becomes out of synchronization attributed to any cause in the second transmitter/receiver 400B, a request signal for the reference clock signal as a common-mode signal is generated and output to the transmission line 300 by the clock reproduction circuit 410 of the second transmitter/receiver 400B.

In response to this, in the upstream signal receiver 110 of the first transmitter/receiver 200B, the detection signal at the high level is generated by the differential voltage detection circuit 111 and the selection control signal REFREQ at the high level is output from the first comparator 112.

This selection control signal REFREQ at the high level is input to the selection signal terminal S of the selector 102. In accordance with this, the signal input to the input terminal T1 is selected by the selector 102.

Specifically, the reference clock signal TCK/N output from the frequency divider 103 is selected by the selector 102 to be output to the transmission line 300 via the differential driver 104.

As shown in the diagram, the clock reproduction circuit 410 has a voltage-controlled oscillator (VCO) 301, a loop filter 302, a phase detector (PD) 303, a phase frequency detector (PFD) 304, and frequency dividers 305 and 306.

The clock reproduction circuit 410 has a synchronization detection circuit 307, a differential driver 308, a selector 309, a common-mode driver 310 as a buffer, and a switch 311.

The division ratio of the frequency divider 305 is set equal to that of the frequency divider 103 in the first transmitter/receiver 200B. Furthermore, both the division ratios of these frequency dividing circuits can be set to 1. That is, these frequency dividers can be omitted.

By providing the frequency dividers 103 and 305 in the first transmitter/receiver 200B and the second transmitter/receiver 400B, respectively, the frequency of the reference clock signal RCK (TCK/N) can be reduced and the operating frequency range of the phase frequency detector 304 of the second transmitter/receiver 400B can be decreased.

The downstream signal receiver 320 has a differential receiver 321 and a D flip-flop 322.

A PLL circuit 330 is configured by the phase detector 303, the phase frequency detector 304, the loop filter 302, and the VCO 301.

The phase detector 303 compares the phase of the downstream signal DS (S321) as a reception signal from the differential receiver 321 with the phase of a clock signal LCK from the VCO 301 and generates an oscillation control signal S303 depending on the comparison result to output it to the loop filter 302.

Figure 17:
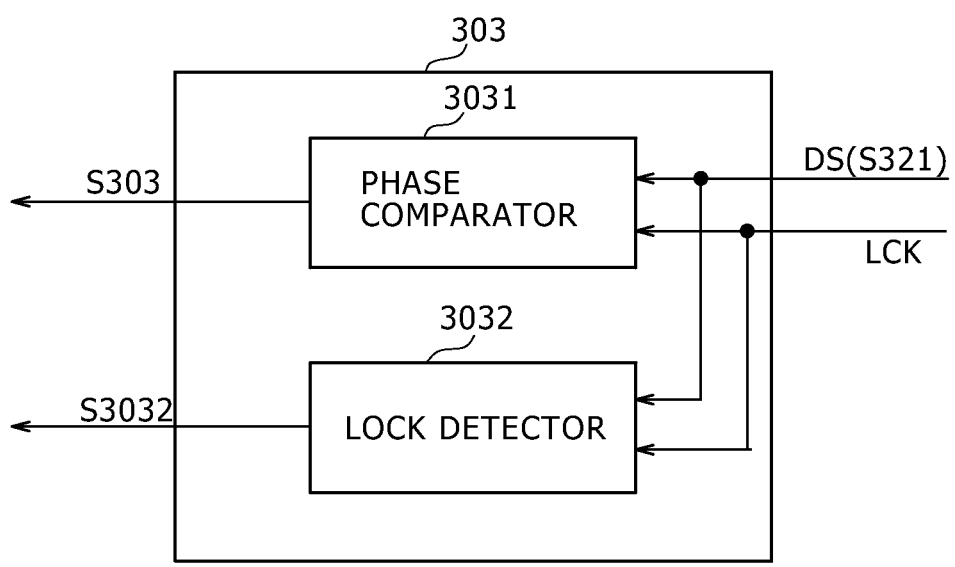
FIG. 17 is a circuit diagram showing one configuration example of a phase detector.

FIG. 17 is a circuit diagram showing one configuration example of the phase detector 303.

As shown in FIG. 17, the phase detector 303 of the present example is configured by a phase comparator 3031 and a lock detector 3032.

The phase comparator 3031 compares the phase of the clock signal LCK generated by the VCO 301 with the phase of the transmitted signal from the transmission line 300 and outputs the oscillation control signal S303 depending on the comparison result.

The lock detector 3032 generates a lock detection signal S3032 indicating the synchronization state of the clock signal LCK and outputs it to the synchronization detection circuit 307.

It is also possible to provide the lock detector 3032 separately from the phase detector 303.

The phase frequency detector 304 compares the frequency of the frequency-divided signal from the frequency divider 305 with the frequency of the reference clock signal TCK/N (RCK) transmitted from the transmission line 300 and outputs an oscillation control signal S304 depending on the comparison result.

The loop filter 302 removes high-frequency components, noise, and so forth of the oscillation control signal S303 from the phase detector 303 or the oscillation control signal S304 from the phase frequency detector 304 and outputs only low-frequency components to the VCO 301.

The VCO 301 receives an oscillation control signal S302 from the loop filter 302 and controls the frequency of the clock signal LCK in accordance with it.

In the PLL circuit 330 configured in this manner, the clock signal LCK (TCK) having the same frequency as that of the transmission clock signal TCK used by the first transmitter/receiver 200B is obtained by the VCO 301.

The clock signal LCK is used for reception of transmission data or synchronization control of the second transmitter/receiver 400B as a reproduction signal of the transmission clock signal TCK.

In reception, the differential receiver 321 receives a differential signal transmitted from the transmission line 300 to generate the reception signal S321 in response to this and output it to each of the phase detector 303, the phase frequency detector 304, and the flip-flop 322.

The phase detector 303 and the phase frequency detector 304 are provided with an enable signal terminal and the operating/non-operating state thereof is set depending on the level of an input enable signal.

Here, suppose that both the phase detector 303 and the phase frequency detector 304 are low-level enabled circuits. That is, they operate only when a low-level signal is input to the enable signal terminal and do not operate at any other time.

Enable signals EN1 and EN2 to control the operation state of the phase detector 303 and the phase frequency detector 304 are generated by the differential driver 308. The lock detector 3032 in the phase detector 303 is set to the operating state irrespective of the enable signal EN1 input to the phase detector 303.

In normal operation, the enable signal EN1 at the low level and the enable signal EN2 at the high level are generated by the differential driver 308. Thus, only the phase detector 303 is set to the operating state and the phase frequency detector 304 is set to the non-operating state.

In the second transmitter/receiver 400B, in the initialization state or in normal reception operation, the frequency of the clock signal LCK generated by the VCO 301 often greatly deviates from the frequency of the clock signal TCK used by the first transmitter/receiver 200B attributed to any cause.

At this time, e.g. the lock detection signal at the low level indicating the frequency deviation is generated and output to the synchronization detection circuit 307 by the lock detector 3032 provided in the phase detector 303.

The synchronization detection circuit 307 generates a synchronization control signal LOCK (S307) in response to the lock detection signal S3032 from the lock detector 3032.

For example, when receiving the lock detection signal S3032 at the low level from the lock detector 3032, the synchronization detection circuit 307 generates the synchronization control signal LOCK at the low level L and outputs it to each of the differential driver 308, the selector 309, and the switch 311.

The synchronization control signal LOCK is e.g. a pulse signal having a certain time width.

Upon receiving the synchronization control signal LOCK, the differential driver 308 generates the enable signal EN1 at the high level and the enable signal EN2 at the low level and outputs them to the phase detector 303 and the phase frequency detector 304, respectively.

In response to this, the phase detector 303 is set to the non-operating state and the phase frequency detector 304 is set to the operating state.

If the synchronization control signal LOCK by the synchronization detection circuit 307, supplied to a selection signal terminal S of the selector 309, is at the high level H, the selector 309 deems that synchronization is established, and selects the user signal as an upstream signal US2 to output it to the common-mode driver 310.

If the synchronization control signal LOCK is at the low level L, the selector 309 deems that synchronization is not established, and selects the reference clock request signal as an upstream signal US1 resulting from frequency division of the clock signal LCK by the frequency dividers 305 and 306 to output it to the common-mode driver 310.

As the user signal, a data format in which the interval having no data is fixed to "High" like e.g. a UART is assumed. The comparison voltage VCOM of the second comparator 114 of the upstream signal receiver 110 is set somewhat low so that "High" can be recognized.

In the case of a data format in which the interval having no data is "Low," conversely the comparison voltage VCOM is set somewhat high so that "Low" can be recognized.

The reference clock request signal is a clock signal resulting from frequency division of the output of the VCO 301 in the PLL circuit 330. This clock signal is the free-running clock of the VCO 301 when synchronization is not established.

A common-mode signal is generated and output to the transmission line 300 by the common-mode driver 310.

At this time, if the synchronization control signal LOCK is at the high level H, the switch 311 is turned on and the user signal selected by the selector 309 is transmitted to the transmission line 300 as a both-phase signal (positive phase and reverse phase).

At this time, the average voltage of the pair of signal lines configuring the transmission line 300 is kept at the high level, specifically e.g. 1 V.

If the synchronization control signal LOCK is at the low level L, the switch 311 is turned off and the reference clock request signal selected by the selector 309 is transmitted to the transmission line 300 as a single-phase signal (positive phase or reverse phase).

When a single-phase signal is being output to the transmission line 300, in the upstream signal receiver 110 of the first transmitter/receiver 200B, the detection signal S111 at the high level is output by the differential voltage detection circuit 111. As a result, the selection control signal REFREQ at the high level is output by the first comparator 112.

In accordance with this, by the selector 102, the reference clock TCK/N (RCK) from the frequency divider 103 is selected and output to the transmission line 300 via the differential driver 104.

When this reference clock is requested, the upstream signal output UPDAO is masked by the gate 115 because the selection control signal REFREQ is at the high level H.

In the downstream signal receiver 320 of the second transmitter/receiver 400B, the reception signal S321 synchronized with the reference clock TCK/N (RCK) is output by the differential receiver 321.

This signal is input to the phase frequency detector 304 set to the operating state by the enable signal EN2 at the low level. Furthermore, the frequency of the clock signal LCK output by the VCO 301 is divided by N by the frequency divider 305 and the divided signal is also input to the phase frequency detector 304.

By the phase frequency detector 304, the frequency of the reception signal S321 is compared with that of the divided signal from the frequency divider 305 and the oscillation control signal S304 is generated depending on the comparison result to be output to the loop filter 302.

By the loop filter 302, high-frequency components, noise, and so forth of the oscillation control signal S304 from the phase frequency detector 304 are removed and only low-frequency components are output to the VCO 301.

Then, in the VCO 301, the frequency of the clock signal LCK is controlled in accordance with the oscillation control signal S302 from the loop filter 302.

By this control, the oscillation frequency of the VCO 301 is so controlled that the frequency of the divided signal from the frequency divider 305 corresponds with that of the reference clock TCK/N (RCK).

Thereby, the frequency of the clock signal LCK generated by the VCO 301 corresponds with that of the transmission clock signal TCK used by the first transmitter/receiver 200B.

When the frequencies correspond with each other, the lock detection signal S3032 at the high level is generated and output to the synchronization detection circuit 307 by the lock detector 3032 provided in the phase detector 303.

In response to this, the synchronization control signal LOCK at the high level is output by the synchronization detection circuit 307. Thus, the signal selected by the selector 309 is switched from the reference clock request signal to the user signal and the generation of the single-phase signal by the common-mode driver 310 is stopped. At this time, the switch 311 is turned on.

Thereby, the detection signal S111 at the low level is output by the differential voltage detection circuit 111 of the first transmitter/receiver 200B, and the selection control signal REFREQ at the low level is generated and input to the selection signal terminal S of the selector 102 by the first comparator 112.

As a result, the output signal to the transmission line 300 is switched from the reference clock signal TCK/N to the transmission data SDATA by the selector 102.

Furthermore, if the synchronization control signal LOCK is at the high level H, when the switch 311 is turned on and the user signal selected by the selector 309 is transmitted to the transmission line 300 as a both-phase signal (positive phase and reverse phase), the following processing is executed in the first transmitter/receiver 200B.

Because the common-mode signal is applied to the transmission line 300, the common-mode voltage detection circuit 113 detects it and outputs it to the second comparator 114.

The second comparator 114 compares the detection signal UPDAL from the common-mode voltage detection circuit 113 with the comparison voltage VCOM and outputs the comparison result as the upstream data UPDAO through the gate 115.

In the clock reproduction circuit 410 of the second transmitter/receiver 400B, by the differential driver 308, the enable signal EN1 at the low level and the enable signal EN2 at the high level are generated and output to the phase detector 303 and the phase frequency detector 304, respectively.

Thereby, the phase frequency detector 304 is switched to the non-operating state and the phase detector 303 is switched to the operating state.

Specifically, when the frequency of the clock signal LCK generated by the VCO 301 corresponds with that of the transmission clock signal TCK used by the first transmitter/receiver 200B, the PLL circuit configured by the phase detector 303, the loop filter 302, and the VCO 301 operates.

Furthermore, control is so carried out that the phase of the clock signal LCK generated by the VCO 301 corresponds with that of the reception signal S321 output from the differential receiver 321.

Moreover, the data SDATA transmitted from the transmission line 300 is sequentially output by the flip-flop 322 in accordance with the timing of the clock signal LCK generated by the VCO 301.

The output data SDATA of the flip-flop 322 is converted to e.g. n-bit data and output by a serial/parallel conversion circuit in the second transmitter/receiver 400B.

By the above-described operation, the data transmitted from the first transmitter/receiver 200B is accurately received by the second transmitter/receiver 400B.

The following processing is executed when the frequency of the clock signal LCK of the second transmitter/receiver 400B deviates from that of the transmission clock signal TCK used by the first transmitter/receiver 200B attributed to e.g. noise at the time of initialization or in normal data transmission.

By the clock reproduction circuit 410, a signal to request transmission of the reference clock signal RCK is selected by the selector 309 and a common-mode signal is output to the common-mode driver 310. This signal is output to the transmission line 300 as a single-phase signal because the switch 311 is in the off-state.

In the upstream signal receiver 110 of the first transmitter/receiver 200B, the reference clock request signal as the single-phase signal is detected. In response to this, the transmission signal is switched to the reference clock signal TCK/N (RCK) by the selector 102 to be output to the transmission line 300.

In the second transmitter/receiver 400B, the oscillation frequency is controlled by the PLL circuit configured by the phase frequency detector 304, the loop filter 302, and the VCO 301 until the frequency of the divided signal of the frequency divider 305 corresponds with that of the reference clock signal RCK.

When the frequencies correspond with each other, the generation of the reference clock request signal is stopped and the transmission signal is switched to the normal transmission data SDATA in the first transmitter/receiver 200B.

In parallel to this, in the clock reproduction circuit 410, the clock signal LCK having the same frequency as that of the transmission clock signal TCK used by the first transmitter/receiver 200B is generated by the PLL circuit configured by the phase detector 303, the loop filter 302, and the VCO 301. Based on this, the data transmitted by the transmission line 300 is received.

As described above, the following advantageous effects can be achieved according to the present seventh embodiment.

Two or more kinds of signals can be transmitted as upstream communication in conjunction with downstream communication by a pair of AC-coupled data transmission lines.

That is, the present embodiment enables two or more kinds of upstream communication by the AC-coupled transmission lines with a simple configuration and can respond to diversification of the system.

Furthermore, a wide range of the transmission rate can be covered and the PLL circuit can be rapidly locked to the transmission clock. In addition, an effective clock reproduction circuit can be realized with a simple circuit configuration without the need to increase a transmission medium.

8. Eighth Embodiment

Figure 18:
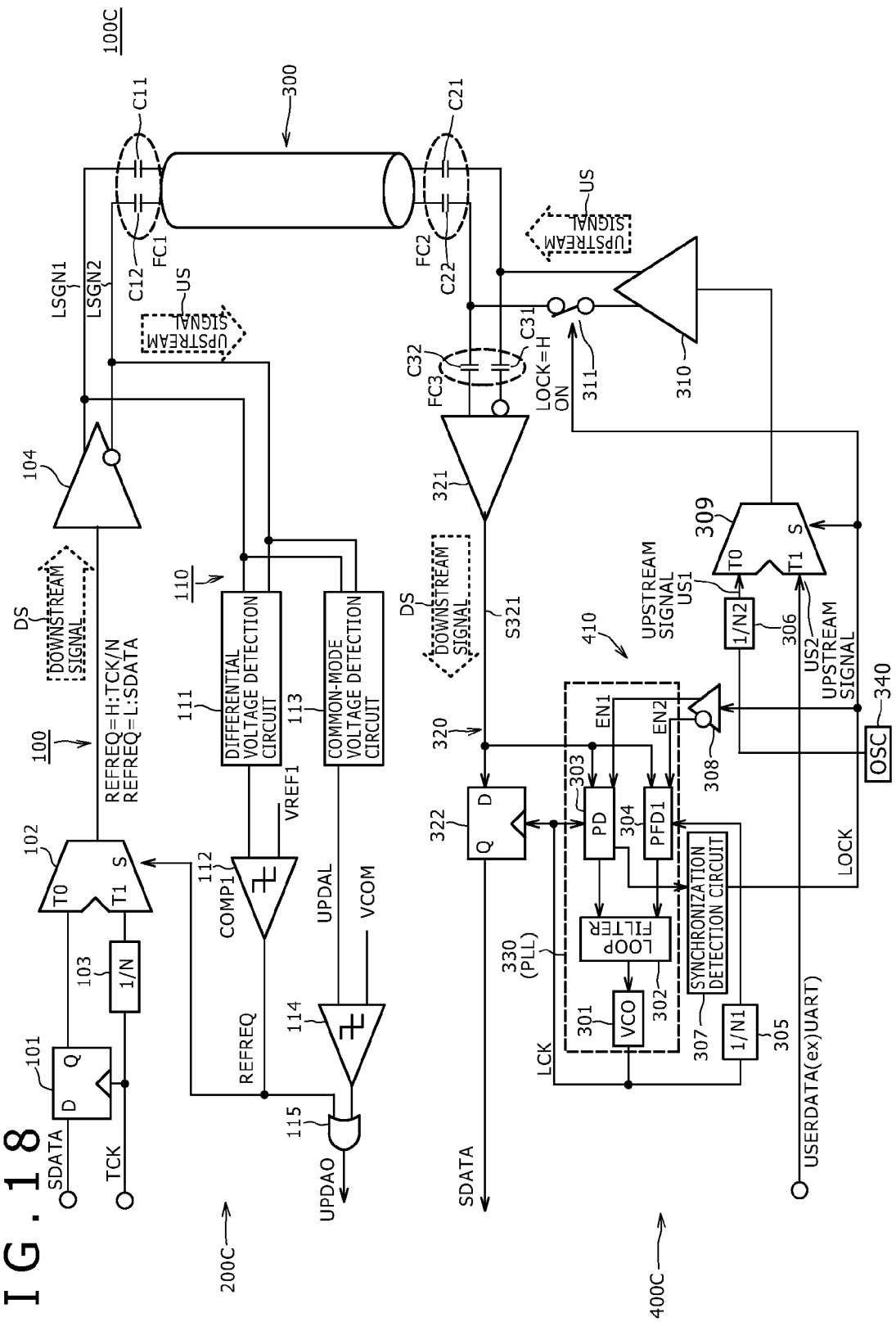
FIG. 18 is a circuit diagram showing a data transmission device according to an eighth embodiment.

FIG. 18 is a circuit diagram showing a data transmission device according to the present eighth embodiment.

A data transmission device 100C according to the present eighth embodiment is different from the data transmission device 100B of the seventh embodiment in that a frequency-divided clock of the output clock of an oscillator (OSC) 340 provided separately from the PLL circuit 330 is employed as the reference clock request signal as the upstream signal US1.

A value from 1 to an arbitrary value can be selected as the frequency division value of the frequency divider 306 and therefore the output clock itself of the oscillator 340 may be employed.

When the PLL circuit 330 ensures a wide range, if the clock cycle becomes too long at the time of the minimum frequency and the area of capacitance for hold and so forth in the differential voltage detection circuit 111 should be large, the present configuration provides a more advantageous effect because the clock cycle range of the upstream signal US1 can be narrowed.

The other configuration is the same as that of the seventh embodiment. According to the eighth embodiment, the same advantageous effects as those of the above-described seventh embodiment can be achieved besides the above-described effect.

9. Ninth Embodiment

Figure 19:
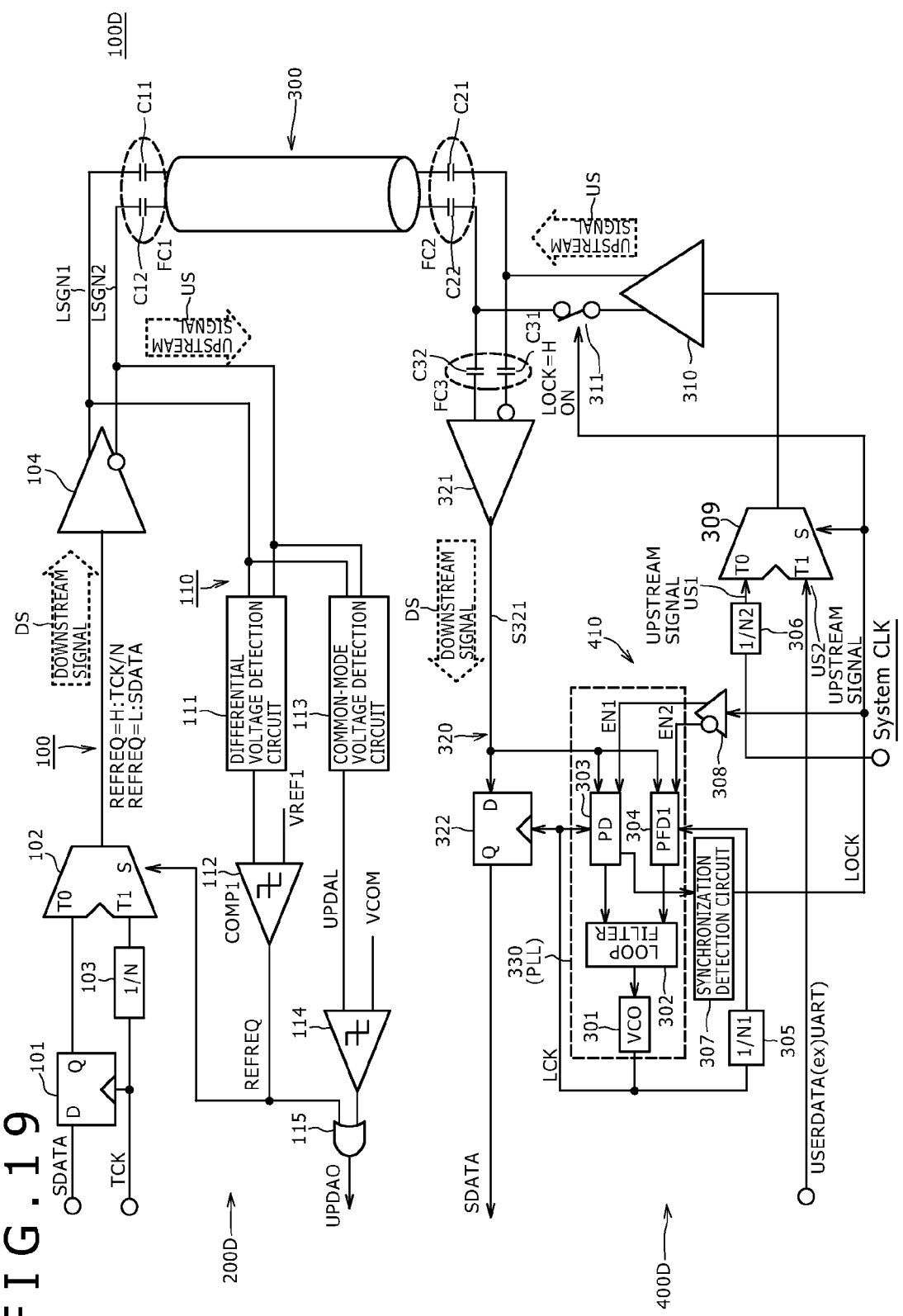
FIG. 19 is a circuit diagram showing a data transmission device according to a ninth embodiment.

FIG. 19 is a circuit diagram showing a data transmission device according to the present ninth embodiment.

A data transmission device 100D according to the present ninth embodiment is different from the data transmission device 100B of the seventh embodiment in that a frequency-divided clock of a system clock [System CLK] provided separately from the PLL circuit 330 is employed as the reference clock request signal as the upstream signal US1.

If the system CLK exists in the same device for a wide variety of systems, the clock cycle can be set constant by a useful method. Thus, the ninth embodiment is more advantageous over the eighth embodiment.

The other configuration is the same as that of the seventh embodiment. According to the ninth embodiment, the same advantageous effects as those of the above-described seventh embodiment can be achieved besides the above-described effect.

10. Tenth Embodiment

Figure 20:
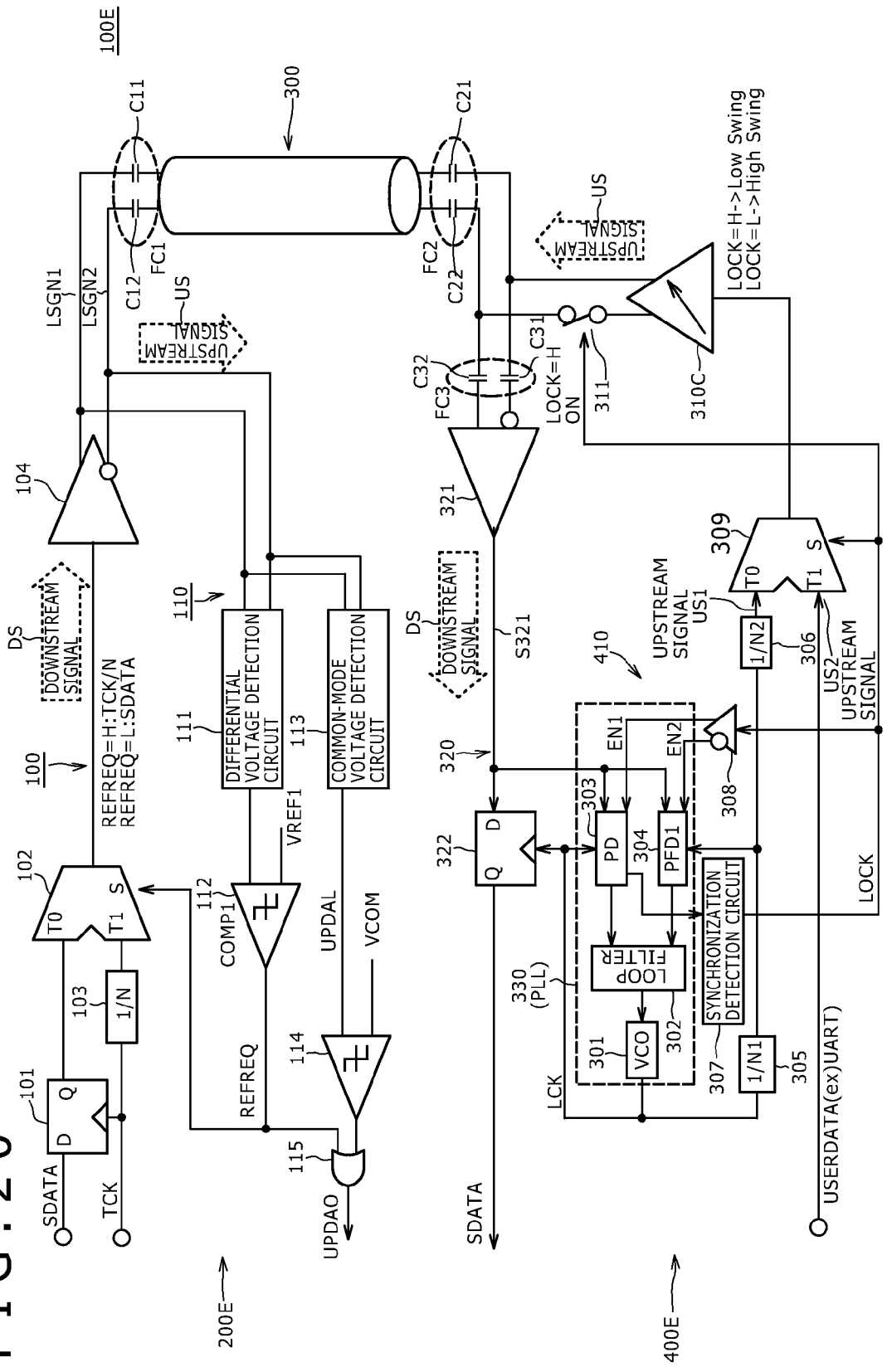
FIG. 20 is a circuit diagram showing a data transmission device according to a tenth embodiment.

FIG. 20 is a circuit diagram showing a data transmission device according to the present tenth embodiment.

The difference of a data transmission device 100E according to the present tenth embodiment from the data transmission device 100B of the seventh embodiment is as follows.

In the present data transmission device 100E, a common-mode driver 310C is so configured as to be capable of adjusting amplitude. When the reference clock request signal as the upstream signal US1 is transmitted, the amplitude is increased by the common-mode driver 310C as a buffer.

This provides an advantageous effect that detection by the differential voltage detection circuit 111 of the upstream signal receiver 110 is facilitated.

The present tenth embodiment is shown as an application example of the seventh embodiment. However, also in the eighth embodiment and the ninth embodiment, the same advantageous effect as the above-described effect can be achieved by similarly increasing the amplitude of the reference clock request signal as the upstream signal US1 when the reference clock is requested.

11. Eleventh Embodiment

Figure 21:
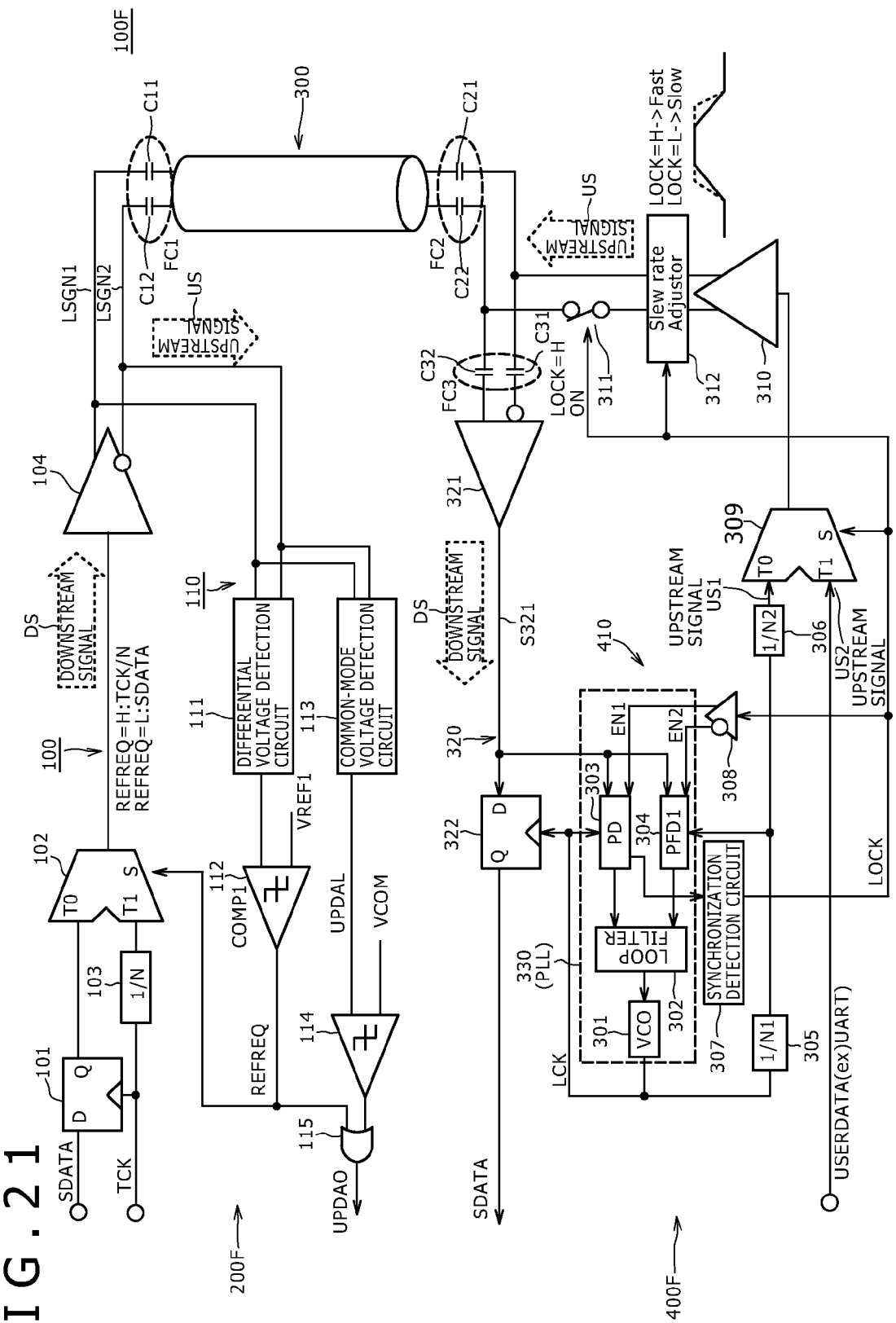
FIG. 21 is a circuit diagram showing a data transmission device according to an eleventh embodiment.

FIG. 21 is a circuit diagram showing a data transmission device according to the present eleventh embodiment.

The difference of a data transmission device 100F according to the present eleventh embodiment from the data transmission device 100B of the seventh embodiment is as follows.

In the present data transmission device 100F, a slew rate adjustor 312 is disposed at the output stage of the common-mode driver 310 as a buffer of the upstream signal.

The slew rate adjustor 312 is effective only when the reference clock request signal as the upstream signal US1 is transmitted, and is disposed for the purpose of alleviating the influence on the differential receiver 321 of the downstream signal receiver 320 when only a single-phase signal is transmitted.

Normally, upstream communication uses a signal whose speed is sufficiently lower than that for downstream communication (e.g. upstream communication: several Gbps, downstream communication: several Mbps). When an upstream signal is transmitted with only a single phase, some influence is often exerted although the constant of the capacitance of the capacitors C31 and C32 is so decided as not to allow the passage of the low-speed signal.

Therefore, the slew rate of the upstream signal itself is decreased to alleviate this influence.

In the case of the upstream signal US2, which is the user signal, a limit to the slew rate appears depending on the transmission rate.

In contrast, in the case of the upstream signal US1, the clock cycle can be decreased because the value N1 and the value N2 of the frequency dividers 305 and 306 can be freely set and the slew rate can be set lower than that of the upstream signal US2.

The present eleventh embodiment is shown as an application example of the seventh embodiment. However, also in the eighth embodiment and the ninth embodiment, the same advantageous effect as the above-described effect can be achieved by similarly decreasing the slew rate of the upstream signal US1.

The present technique can employ the following configurations.

(1) A data reproduction circuit including
a comparator configured to compare input data resulting from capacitive coupling with a comparison voltage as a threshold voltage and output a comparison result, and
a comparison voltage variable section configured to change the comparison voltage along a mark rate of the input data and supply the changed comparison voltage to the comparator.

(2) The data reproduction circuit according to the above-described (1), wherein the comparison voltage variable section changes the comparison voltage depending on a differential voltage between a voltage obtained by peak hold of the input data and a reference voltage.

(3) The data reproduction circuit according to the above-described (2), wherein the comparison voltage variable section includes
a peak hold section that generates a voltage obtained by holding a peak value of the input data,
an operational amplifier that generates a voltage depending on a difference between the voltage obtained by peak hold by the peak hold section and a first reference voltage, and
an adder that adds the voltage depending on the difference by the operational amplifier to a second reference voltage as a basic threshold voltage and supplies a voltage resulting from the addition to the comparator as the comparison voltage.

(4) The data reproduction circuit according to the above-described (2), wherein the comparison voltage variable section includes
a peak hold section that generates a voltage obtained by holding a peak value of the input data, and
an offset voltage adder that adds a fixed offset voltage to the voltage obtained by peak hold by the peak hold section and supplies a voltage resulting from the addition of the offset voltage to the comparator as the comparison voltage.

(5) The data reproduction circuit according to the above-described (1), wherein the comparison voltage variable section changes the comparison voltage depending on a differential voltage between a voltage obtained by bottom hold of the input data and a reference voltage.

(6) The data reproduction circuit according to the above-described (5), wherein the comparison voltage variable section includes
a bottom hold section that generates a voltage obtained by holding a bottom value of the input data,
an operational amplifier that generates a voltage depending on a difference between the voltage obtained by bottom hold by the bottom hold section and a first reference voltage, and
an adder that adds the voltage depending on the difference by the operational amplifier to a second reference voltage as a basic threshold voltage and supplies a voltage resulting from the addition to the comparator as the comparison voltage.

(7) The data reproduction circuit according to the above-described (5), wherein the comparison voltage variable section includes
a bottom hold section that generates a voltage obtained by holding a bottom value of the input data, and
an offset voltage adder that adds a fixed offset voltage to the voltage obtained by bottom hold by the bottom hold section and supplies a voltage resulting from the addition of the offset voltage to the comparator as the comparison voltage.

(8) The data reproduction circuit according to the above-described (1), wherein the comparison voltage variable section supplies an average value of a voltage obtained by holding a peak value of the input data and a voltage obtained by holding a bottom value of the input data to the comparator as the comparison voltage.

(9) The data reproduction circuit according to the above-described (8), wherein the comparison voltage variable section includes
a peak hold section that generates the voltage obtained by holding the peak value of the input data,
a bottom hold section that generates the voltage obtained by holding the bottom value of the input data, and
an averager that supplies an average value of the voltage obtained by peak hold by the peak hold section and the voltage obtained by bottom hold by the bottom hold section to the comparator as the comparison voltage.

(10) The data reproduction circuit according to the above-described (9), wherein the averager adds a positive offset voltage to the average value and supplies a resulting voltage to the comparator as the comparison voltage, for an input format in which an interval having no data is set low (L).

(11) The data reproduction circuit according to the above-described (9) or (10), wherein the averager adds a negative offset voltage to the average value and supplies a resulting voltage to the comparator as the comparison voltage, for an input format in which an interval having no data is set high (H).

(12) The data reproduction circuit according to any one of the above-described (1) to (11), wherein an interval having no data is fixed to high (H) or low (L) in the input data.

(13) A data transmission device including
a transmission line configured to be formed by a pair of signal lines to which a capacitor that blocks a direct-current component and allows passage of an alternating-current signal based on a transmission signal is connected,
a first transmitter/receiver that transmits transmission data via the transmission line at a transmission rate set by a transmission clock signal, and
a second transmitter/receiver that reproduces a reception clock signal based on a reception signal received via the transmission line and receives the transmission data transmitted from the first transmitter/receiver, wherein
 the first transmitter/receiver includes
 an output circuit that selects either the transmission data or a reference clock signal in accordance with a selection control signal and outputs the transmission data or the reference clock signal to the transmission line, and
 a data reproduction circuit that detects a common-mode signal transmitted from the second transmitter/receiver via the transmission line and reproduces input data resulting from capacitive coupling,
 the data reproduction circuit includes
 a comparator that compares the input data resulting from capacitive coupling with a comparison voltage as a threshold voltage and outputs a comparison result, and
 a comparison voltage variable section that changes the comparison voltage along a mark rate of the input data and supplies the changed comparison voltage to the comparator,
 the second transmitter/receiver includes
 a clock reproduction circuit that generates a clock signal in response to the reference clock signal or the transmission data transmitted via the transmission line, and
 the second transmitter/receiver outputs a request signal to the transmission line if frequency of the clock signal generated by the clock reproduction circuit is different from signal frequency of the transmission line.

(14) The data transmission device according to the above-described (13), wherein a signal receiver of the first transmitter/receiver receives a single-phase signal with a positive phase or a reverse phase and a both-phase signal with a positive phase and a reverse phase transmitted from the second transmitter/receiver via the transmission line to separate and determine the single-phase signal and the both-phase signal in association with a voltage difference of the received signal, and the signal receiver of the first transmitter/receiver generates the selection control signal to select the transmission data or the reference clock signal depending on a determination result to output the selection control signal to the output circuit, and the second transmitter/receiver outputs the request signal to the transmission line as a single-phase signal or a common-mode signal if the frequency of the clock signal generated by the clock reproduction circuit is different from the signal frequency of the transmission line, the second transmitter/receiver outputs predetermined data to the transmission line as a both-phase signal if the frequency of the generated clock signal is equivalent to the signal frequency of the transmission line, and the second transmitter/receiver is capable of transmitting the single-phase signal and the both-phase signal to the transmission line simultaneously in parallel.

(15) The data transmission device according to the above-described (14), wherein the second transmitter/receiver outputs the request signal to the transmission line as a single-phase signal or a common-mode signal, the second transmitter/receiver outputs predetermined data to the transmission line as a both-phase signal, if a differential voltage of the received signal is higher than a threshold value, the signal receiver of the first transmitter/receiver determines that a single-phase signal is received and the request signal for the reference clock signal is received, and outputs the selection control signal to the output circuit to select the reference clock signal instead of the transmission data, and if the differential voltage of the received signal is equal to or lower than the threshold value, the signal receiver of the first transmitter/receiver determines that a both-phase signal is received, and outputs the selection control signal to the output circuit to select the transmission data.

(16) The data transmission device according to the above-described (15), wherein if determining that a single-phase signal is received and generating the selection control signal to select the reference clock signal, the signal receiver of the first transmitter/receiver stops output of data reproduced by the data reproduction circuit even if the common-mode signal is detected.

(17) The data transmission device according to any one of the above-described (13) to (16), wherein the comparison voltage variable section changes the comparison voltage depending on a differential voltage between a voltage obtained by peak hold of the input data and a reference voltage.

(18) The data transmission device according to any one of the above-described (13) to (16), wherein the comparison voltage variable section changes the comparison voltage depending on a differential voltage between a voltage obtained by bottom hold of the input data and a reference voltage.

(19) The data transmission device according to any one of the above-described (13) to (16), wherein the comparison voltage variable section supplies an average value of a voltage obtained by holding a peak value of the input data and a voltage obtained by holding a bottom value of the input data to the comparator as the comparison voltage.

(20) A data transmission device including a transmission line configured to be formed by a pair of signal lines to which a capacitor that blocks a direct-current component and allows passage of an alternating-current signal based on a transmission signal is connected, a first transmitter/receiver that transmits transmission data via the transmission line at a transmission rate set by a transmission clock signal, and a second transmitter/receiver that reproduces a reception clock signal based on a reception signal received via the transmission line and receives the transmission data transmitted from the first transmitter/receiver, wherein the first transmitter/receiver includes an output circuit that selects either the transmission data or a reference clock signal in accordance with a selection control signal and outputs the transmission data or the reference clock signal to the transmission line, and a signal receiver that receives a single-phase signal with a positive phase or a reverse phase and a both-phase signal with a positive phase and a reverse phase transmitted from the second transmitter/receiver via the transmission line to separate and determine the single-phase signal and the both-phase signal in association with a voltage difference of the received signal, and generates the selection control signal to select the transmission data or the reference clock signal depending on a determination result to output the selection control signal to the output circuit, the second transmitter/receiver includes a clock reproduction circuit that generates a clock signal in response to the reference clock signal or the transmission data transmitted via the transmission line and outputs a request signal to the transmission line as a single-phase signal or a common-mode signal if frequency of the generated clock signal is different from signal frequency of the transmission line, the second transmitter/receiver outputs predetermined data to the transmission line as a both-phase signal if the frequency of the generated clock signal is equivalent to the signal frequency of the transmission line, and the second transmitter/receiver is capable of transmitting the single-phase signal and the both-phase signal to the transmission line simultaneously in parallel.

(21) The data transmission device according to the above-described (20), wherein the second transmitter/receiver outputs the request signal to the transmission line as a single-phase signal or a common-mode signal, the second transmitter/receiver outputs predetermined data to the transmission line as a both-phase signal, if a differential voltage of the received signal is higher than a threshold value, the signal receiver of the first transmitter/receiver determines that a single-phase signal is received and the request signal for the reference clock signal is received, and outputs the selection control signal to the output circuit to select the reference clock signal instead of the transmission data, and if the differential voltage of the received signal is equal to or lower than the threshold value, the signal receiver of the first transmitter/receiver determines that a both-phase signal is received, and outputs the selection control signal to the output circuit to select the transmission data.

(22) The data transmission device according to the above-described (21), wherein the signal receiver of the first transmitter/receiver includes a common-mode signal detector that detects a common-mode signal, and the signal receiver of the first transmitter/receiver outputs data transmitted from the second transmitter/receiver when detecting a common-mode signal by the common-mode signal detector.

(23) The data transmission device according to the above-described (22), wherein if determining that a single-phase signal is received and generating the selection control signal to select the reference clock signal, the signal receiver of the first transmitter/receiver stops output of data transmitted from the second transmitter/receiver even if a common-mode signal is detected by the common-mode signal detector.

(24) The data transmission device according to any one of the above-described (20) to (23), wherein the second transmitter/receiver includes a buffer that increases amplitude of the single-phase signal if only the single-phase signal is transmitted.

(25) The data transmission device according to any one of the above-described (20) to (23), wherein the second transmitter/receiver includes a slew rate adjustor that decreases a slew rate of the single-phase signal if only the single-phase signal is transmitted.

(26) The data transmission device according to any one of the above-described (20) to (25), wherein the second transmitter/receiver transmits a clock of an oscillator of a PLL circuit in the data transmission device or a frequency-divided clock of the clock as the request signal for the reference clock signal.

(27) The data transmission device according to any one of the above-described (20) to (25), wherein the second transmitter/receiver transmits a clock of an oscillator provided separately from an oscillator of a PLL circuit in the data transmission device or a frequency-divided clock of the clock as the request signal for the reference clock signal.

(28) The data transmission device according to any one of the above-described (20) to (25), wherein the second transmitter/receiver transmits a system clock in the data transmission device or a frequency-divided clock of the system clock as the request signal for the reference clock signal.

(29) A data transmission device including
a transmitter/receiver configured to transmit transmission data at a transmission rate set by a transmission clock signal via a transmission line formed by a pair of signal lines to which a capacitor that blocks a direct-current component and allows passage of an alternating-current signal based on a transmission signal is connected, and receive a signal transmitted via the transmission line, wherein the transmitter/receiver includes an output circuit that selects either the transmission data or a reference clock signal in accordance with a selection control signal and outputs the transmission data or the reference clock signal to the transmission line, and a signal receiver that receives a single-phase signal with a positive phase or a reverse phase and a both-phase signal with a positive phase and a reverse phase transmitted via the transmission line to separate and determine the single-phase signal and the both-phase signal in association with a voltage difference of the received signal, and generates the selection control signal to select the transmission data or the reference clock signal depending on a determination result to output the selection control signal to the output circuit.

(30) The data transmission device according to the above-described (29), wherein a signal transmitted via the transmission line is a request signal as a single-phase signal or a common-mode signal or predetermined data as a both-phase signal, if a differential voltage of the received signal is higher than a threshold value, the signal receiver determines that a single-phase signal is received and the request signal for the reference clock signal is received, and outputs the selection control signal to the output circuit to select the reference clock signal instead of the transmission data, and if the differential voltage of the received signal is equal to or lower than the threshold value, the signal receiver determines that a both-phase signal is received, and outputs the selection control signal to the output circuit to select the transmission data.

(31) The data transmission device according to the above-described (30), wherein the signal receiver includes a common-mode signal detector that detects a common-mode signal, and the signal receiver outputs data transmitted via the transmission line when detecting a common-mode signal by the common-mode signal detector.

(32) The data transmission device according to the above-described (31), wherein if determining that a single-phase signal is received and generating the selection control signal to select the reference clock signal, the signal receiver stops output of data transmitted via the transmission line even if a common-mode signal is detected by the common-mode signal detector.

(33) A data transmission device including
a transmitter/receiver configured to reproduce a reception clock signal based on a reception signal received via a transmission line formed by a pair of signal lines to which a capacitor that blocks a direct-current component and allows passage of an alternating-current signal based on a transmission signal is connected, and receive transmission data transmitted via the transmission line, wherein the transmitter/receiver includes a clock reproduction circuit that generates a clock signal in response to a reference clock signal or the transmission data transmitted via the transmission line and outputs a request signal to the transmission line as a single-phase signal or a common-mode signal if frequency of the generated clock signal is different from signal frequency of the transmission line, the transmitter/receiver outputs predetermined data to the transmission line as a both-phase signal if the frequency of the generated clock signal is equivalent to the signal frequency of the transmission line, and the transmitter/receiver is capable of transmitting the single-phase signal and the both-phase signal to the transmission line simultaneously in parallel.

(34) The data transmission device according to the above-described (33), wherein the transmitter/receiver includes a buffer that increases amplitude of the single-phase signal if only the single-phase signal is transmitted.

(35) The data transmission device according to the above-described (33), wherein the transmitter/receiver includes a slew rate adjustor that decreases a slew rate of the single-phase signal if only the single-phase signal is transmitted.

(36) A data transmission method including
a first transmission/reception step of transmitting transmission data at a transmission rate set by a transmission clock signal via a transmission line formed by a pair of signal lines to which a capacitor that blocks a direct-current component and allows passage of an alternating-current signal based on a transmission signal is connected, and a second transmission/reception step of reproducing a reception clock signal based on a reception signal received via the transmission line and receiving the transmission data transmitted via the transmission line, wherein the first transmission/reception step includes selecting either the transmission data or a reference clock signal in accordance with a selection control signal and outputting the transmission data or the reference clock signal to the transmission line, and receiving a single-phase signal with a positive phase or a reverse phase and a both-phase signal with a positive phase and a reverse phase transmitted via the transmission line to separate and determine the single-phase signal and the both-phase signal in association with a voltage difference of the received signal, and generating the selection control signal to select the transmission data or the reference clock signal depending on a determination result, the second transmission/reception step includes generating a clock signal in response to the reference clock signal or the transmission data transmitted via the transmission line, outputting a request signal to the transmission line as a single-phase signal or a common-mode signal if frequency of the generated clock signal is different from signal frequency of the transmission line, and outputting predetermined data to the transmission line as a both-phase signal if the frequency of the generated clock signal is equivalent to the signal frequency of the transmission line, and the second transmission/reception step is capable of transmitting the single-phase signal and the both-phase signal to the transmission line simultaneously in parallel.

(37) A data transmission method including a transmission/reception step of transmitting transmission data at a transmission rate set by a transmission clock signal via a transmission line formed by a pair of signal lines to which a capacitor that blocks a direct-current component and allows passage of an alternating-current signal based on a transmission signal is connected, and receiving a signal transmitted via the transmission line, wherein the transmission/reception step includes selecting either the transmission data or a reference clock signal in accordance with a selection control signal and outputting the transmission data or the reference clock signal to the transmission line, and receiving a single-phase signal with a positive phase or a reverse phase and a both-phase signal with a positive phase and a reverse phase transmitted via the transmission line to separate and determine the single-phase signal and the both-phase signal in association with a voltage difference of the received signal, and generating the selection control signal to select the transmission data or the reference clock signal depending on a determination result.

(38) A data transmission method including a transmission/reception step of reproducing a reception clock signal based on a reception signal received via a transmission line formed by a pair of signal lines to which a capacitor that blocks a direct-current component and allows passage of an alternating-current signal based on a transmission signal is connected, and receiving transmission data transmitted via the transmission line, wherein the transmission/reception step includes generating a clock signal in response to a reference clock signal or the transmission data transmitted via the transmission line, outputting a request signal to the transmission line as a single-phase signal or a common-mode signal if frequency of the generated clock signal is different from signal frequency of the transmission line, and outputting predetermined data to the transmission line as a both-phase signal if the frequency of the generated clock signal is equivalent to the signal frequency of the transmission line, and the transmission/reception step is capable of transmitting the single-phase signal and the both-phase signal to the transmission line simultaneously in parallel.

The present disclosure contains subject matter related to that disclosed in Japanese Priority Patent Application JP2012-019989 filed in the Japan Patent Office on Feb. 1, 2012 and Japanese Priority Patent Application JP2012-019991 filed in the Japan Patent Office on Feb. 1, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A data transmission device comprising:

a transmission line configured to be formed by a pair of signal lines to which a capacitor that blocks a direct-current component and allows passage of an alternating-current signal based on a transmission signal is connected, a first transmitter/receiver configured to transmit transmission data via the transmission line at a transmission rate set by a transmission clock signal; and a second transmitter/receiver configured to reproduce a reception clock signal based on a reception signal received via the transmission line and receive the transmission data transmitted from the first transmitter/receiver, wherein the first transmitter/receiver includes:

an output circuit configured to select either the transmission data or a reference clock signal in accordance with a selection control signal and output the transmission data or the reference clock signal to the transmission line, and a data reproduction circuit configured to detect a common-mode signal transmitted from the second transmitter/receiver via the transmission line and reproduce input data resulting from capacitive coupling, the data reproduction circuit including:

a comparator configured to compare input data resulting from capacitive coupling with a comparison voltage as a threshold voltage and output a comparison result; and a comparison voltage variable section configured to change the comparison voltage along a mark rate of the input data and supply the changed comparison voltage to the comparator, the second transmitter/receiver includes:

a clock reproduction circuit configured to generate a clock signal in response to the reference clock signal or the transmission data transmitted via the transmission line, and second transmitter/receiver outputs a request signal to the transmission line if frequency of the clock signal generated by the clock reproduction circuit is different from signal frequency of the transmission line.

2. The data transmission device according to claim 1, wherein a signal receiver of the first transmitter/receiver receives a single-phase signal with a positive phase or a reverse phase and a both-phase signal with a positive phase and a reverse phase transmitted from the second transmitter/receiver via the transmission line to separate and determine the single-phase signal and the both-phase signal in association with a voltage difference of the received signal, and the signal receiver of the first transmitter/receiver generates the selection control signal to select the transmission data or the reference clock signal depending on a determination result to output the selection control signal to the output circuit, the second transmitter/receiver outputs the request signal to the transmission line as a single-phase signal or a common-mode signal if the frequency of the clock signal generated by the clock reproduction circuit is different from the signal frequency of the transmission line, the second transmitter/receiver outputs predetermined data to the transmission line as a both-phase signal if the frequency of the generated clock signal is equivalent to the signal frequency of the transmission line, and the second transmitter/receiver is capable of transmitting the single-phase signal and the both-phase signal to the transmission line simultaneously in parallel.

3. A data transmission device comprising:
a transmission line configured to be formed by a pair of signal lines to which a capacitor that blocks a direct-current component and allows passage of an alternating-current signal based on a transmission signal is connected;
a first transmitter/receiver configured to transmit transmission data via the transmission line at a transmission rate set by a transmission clock signal; and
a second transmitter/receiver configured to reproduce a reception clock signal based on a reception signal received via the transmission line and receive the transmission data transmitted from the first transmitter/receiver, wherein
the first transmitter/receiver includes:
 an output circuit configured to select either the transmission data or a reference clock signal in accordance with a selection control signal and output the transmission data or the reference clock signal to the transmission line, and
 a signal receiver configured to receive a single-phase signal with a positive phase or a reverse phase and a both-phase signal with a positive phase and a reverse phase transmitted from the second transmitter/receiver via the transmission line to separate and determine the single-phase signal and the both-phase signal in association with a voltage difference of the received signal, and generate the selection control signal to select the transmission data or the reference clock signal depending on a determination result to output the selection control signal to the output circuit,
the second transmitter/receiver includes a clock reproduction circuit configured to generate a clock signal in response to the reference clock signal or the transmission data transmitted via the transmission line and outputs a request signal to the transmission line as a single-phase signal or a common-mode signal if frequency of the generated clock signal is different from signal frequency of the transmission line,
the second transmitter/receiver outputs predetermined data to the transmission line as a both-phase signal if the frequency of the generated clock signal is equivalent to the signal frequency of the transmission line, and the second transmitter/receiver is capable of transmitting the single-phase signal and the both-phase signal to the transmission line simultaneously in parallel.

4. The data transmission device according to claim 3, wherein
the second transmitter/receiver outputs the request signal to the transmission line as a single-phase signal or a common-mode signal,
the second transmitter/receiver outputs predetermined data to the transmission line as a both-phase signal,
if a differential voltage of the received signal is higher than a threshold value, the signal receiver of the first transmitter/receiver determines that a single-phase signal is received and the request signal for the reference clock signal is received, and outputs the selection control signal to the output circuit to select the reference clock signal instead of the transmission data, and
if the differential voltage of the received signal is equal to or lower than the threshold value, the signal receiver of the first transmitter/receiver determines that a both-phase signal is received, and outputs the selection control signal to the output circuit to select the transmission data.

5. The data transmission device according to claim 4, wherein
the signal receiver of the first transmitter/receiver includes a common-mode signal detector that detects a common-mode signal, and
the signal receiver of the first transmitter/receiver outputs data transmitted from the second transmitter/receiver when detecting a common-mode signal by the common-mode signal detector.

6. The data transmission device according to claim 5, wherein if determining that a single-phase signal is received and generating the selection control signal to select the reference clock signal, the signal receiver of the first transmitter/receiver stops output of data transmitted from the second transmitter/receiver even if a common-mode signal is detected by the common-mode signal detector.

7. The data transmission device according to claim 3, wherein the second transmitter/receiver includes a buffer that increases amplitude of the single-phase signal if only the single-phase signal is transmitted.

8. The data transmission device according to claim 3, wherein the second transmitter/receiver includes a slew rate adjustor that decreases a slew rate of the single-phase signal if only the single-phase signal is transmitted.

9. The data transmission device according to claim 3, wherein the second transmitter/receiver transmits a clock of an oscillator of a phase locked loop circuit in the data transmission device or a frequency-divided clock of the clock as the request signal for the reference clock signal.

10. A data transmission device comprising
a transmitter/receiver configured to transmit transmission data at a transmission rate set by a transmission clock signal via a transmission line formed by a pair of signal lines to which a capacitor that blocks a direct-current component and allows passage of an alternating-current signal based on a transmission signal is connected, and receive a signal transmitted via the transmission line, wherein
the transmitter/receiver includes:
 an output circuit configured to select either the transmission data or a reference clock signal in accordance with a selection control signal and output the transmission data or the reference clock signal to the transmission line, and a signal receiver configured to receive a single-phase signal with a positive phase or a reverse phase and a both-phase signal with a positive phase and a reverse phase transmitted via the transmission line to separate and determine the single-phase signal and the both-phase signal in association with a voltage difference of the received signal, and generate the selection control signal to select the transmission data or the reference clock signal depending on a determination result to output the selection control signal to the output circuit.

11. The data transmission device according to claim 10, wherein a signal transmitted via the transmission line is a request signal as a single-phase signal or a common-mode signal or predetermined data as a both-phase signal, if a differential voltage of the received signal is higher than a threshold value, the signal receiver determines that a single-phase signal is received and the request signal for the reference clock signal is received, and outputs the selection control signal to the output circuit to select the reference clock signal instead of the transmission data, and if the differential voltage of the received signal is equal to or lower than the threshold value, the signal receiver determines that a both-phase signal is received, and outputs the selection control signal to the output circuit to select the transmission data.

12. The data transmission device according to claim 10, wherein the signal receiver includes a common-mode signal detector that detects a common-mode signal, and the signal receiver outputs data transmitted via the transmission line when detecting a common-mode signal by the common-mode signal detector.

* * * * *